United States Patent
Yomogita et al.

(10) Patent No.: US 9,847,490 B2
(45) Date of Patent: Dec. 19, 2017

(54) COPOLYMER, MATERIAL FOR ORGANIC ELECTRONIC ELEMENT, MATERIAL FOR ORGANIC ELECTROLUMINESCENT ELEMENT, AND ORGANIC ELECTROLUMINESCENT ELEMENT

(71) Applicant: IDEMITSU KOSAN CO., LTD., Chiyoda-ku (JP)

(72) Inventors: Akinori Yomogita, Ichihara (JP); Shigeru Matsuo, Ichihara (JP); Hidetoshi Ono, Ichihara (JP); Kiyoshi Ikeda, Sodegaura (JP); Hironori Kawakami, Katsushika (JP); Masahide Matsuura, Chiba (JP); Mitsunori Ito, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 190 days.

(21) Appl. No.: 14/434,558

(22) PCT Filed: Oct. 2, 2013

(86) PCT No.: PCT/JP2013/076874
§ 371 (c)(1),
(2) Date: Apr. 9, 2015

(87) PCT Pub. No.: WO2014/057852
PCT Pub. Date: Apr. 17, 2014

(65) Prior Publication Data
US 2015/0280131 A1    Oct. 1, 2015

(30) Foreign Application Priority Data

Oct. 9, 2012 (JP) ................. 2012-224388

(51) Int. Cl.
| | | |
|---|---|---|
| C09K 11/06 | (2006.01) |
| H01L 51/00 | (2006.01) |
| C08F 12/26 | (2006.01) |
| C08F 212/14 | (2006.01) |
| C08F 212/32 | (2006.01) |
| C08F 226/06 | (2006.01) |
| C08F 212/12 | (2006.01) |
| C08F 226/12 | (2006.01) |
| H01L 51/50 | (2006.01) |

(52) U.S. Cl.
CPC .......... H01L 51/0042 (2013.01); C08F 12/26 (2013.01); C08F 212/12 (2013.01); C08F 212/14 (2013.01); C08F 212/32 (2013.01); C08F 226/06 (2013.01); C08F 226/12 (2013.01); H01L 51/004 (2013.01); H01L 51/0043 (2013.01); H01L 51/0067 (2013.01); H01L 51/0085 (2013.01); H01L 51/5012 (2013.01); H01L 51/5016 (2013.01)

(58) Field of Classification Search
CPC ............ C09K 11/06; C09K 2211/1003; C09K 2211/1013; C09K 2211/1014; C09K 2211/1018; C09K 2211/1022; C09K 2211/1025; C09K 2211/1029; C09K 2211/103

See application file for complete search history.

(56) References Cited

U.S. PATENT DOCUMENTS

| | | |
|---|---|---|
| 2002/0041979 A1 | 4/2002 | Taguchi |
| 2008/0145705 A1 | 6/2008 | Narihiro et al. |

FOREIGN PATENT DOCUMENTS

| | | |
|---|---|---|
| JP | 2002 105445 | 4/2002 |
| JP | 2005 309898 | 11/2005 |
| JP | 2010 196040 | 9/2010 |
| JP | 2011 042751 | 3/2011 |
| JP | 2011-137910 A | 7/2011 |
| JP | 2011-256263 A | 12/2011 |
| WO | 2005 022961 | 3/2005 |
| WO | 2007 133632 | 11/2007 |
| WO | WO 2011/152060 A1 | 12/2011 |

OTHER PUBLICATIONS

JP 2014540817 search report dated Sep. 13, 2016.*
JP 2014540817 search report dated Jan. 24, 2017.*
Office Action dated Jun. 14, 2016 in Japanese Patent Application No. 2014-540817.
International Search Report dated Dec. 3, 2013 in PCT/JP13/076874 filed Oct. 2, 2013.

* cited by examiner

Primary Examiner — Khanh Tuan Nguyen
Assistant Examiner — Haidung Nguyen
(74) Attorney, Agent, or Firm — Oblon, McClelland, Maier & Neustadt, L.L.P.

(57) ABSTRACT

Provided are a copolymer having plural repeating units each having a specific structure, and having a weight-average molecular weight of from 100,000 to 3,000,000; a material for organic electronic devices and a material for organic electroluminescent devices containing the copolymer; a solution containing the copolymer and a solvent; and an organic electroluminescent device using the material for organic electroluminescent devices. The copolymer has not only charge transporting properties but also solubility and is suitable for forming a film according to a coating method. The present invention provides the copolymer, and a material for organic electronic devices and a material for organic electroluminescent devices containing the copolymer, an organic electroluminescent device, and a solution containing the copolymer.

23 Claims, 5 Drawing Sheets

COPOLYMER, MATERIAL FOR ORGANIC ELECTRONIC ELEMENT, MATERIAL FOR ORGANIC ELECTROLUMINESCENT ELEMENT, AND ORGANIC ELECTROLUMINESCENT ELEMENT

TECHNICAL FIELD

The present invention relates to a copolymer, to a material for electronic devices and a material for organic electroluminescent devices (hereinafter abbreviated to organic EL devices in some cases) comprising the compound, and to an organic EL device, a coating liquid and a method for producing organic EL devices.

BACKGROUND ART

With respect to electronic devices including organic EL devices, heretofore, in general, a film that contains a material for making those devices function has been formed according to a vapor deposition method. On the other hand, it is also investigated to form a film according to a coating method, but it is in a situation in which a material sufficiently suitable for a coating liquid could not as yet been realized, and a development of a polymer material having not only charge transporting properties but also solubility is now under way.

As a material for organic EL devices, polyvinyl carbazole (hereinafter abbreviated to PVK in some cases) has been known through the ages (see PTL 1, page 2, right upper column), and along with the development of organic EL devices, a development of PVK is also under way. PTL 2 describes an organic EL device using a polymer produced through copolymerization of a vinylanthracene derivative and a vinylcarbazole derivative, in which, however, a polymer form having an increased molecular weight is not produced.

PTL 3 discloses a copolymer comprising a unit having a carbazole derivative and a unit having an amino group, in which, however, a polymer form having an increased molecular weight is not produced.

CITATION LIST

Patent Literature

PTL 1: WO2007/133632
PTL 2: JP-A 2010-196040
PTL 3: JP-A 2005-309898

SUMMARY OF INVENTION

Technical Problem

The present invention has been made for solving the above-mentioned problems, and the object thereof is to provide a copolymer having not only charge transporting properties but also solubility and being suitable for forming a film according to a coating method, a material for organic electronic devices, a material for organic EL devices, and an organic electronic EL device, each containing the copolymer, and a coating liquid containing the copolymer.

Solution to Problem

The present inventors have assiduously studied for the purpose of attaining the above-mentioned object and, as a result, have found that a copolymer containing a repeating unit of the following formula (1) or the following formulae (2) and (3) attains the above-mentioned object, and have completed the present invention.

Specifically, the present invention provides the following embodiments (1) to (10).

(1) A copolymer comprising a repeating unit of the following formula (1), which comprises the repeating unit where a is from 1 to 5 and the repeating unit where a is 0 and has a weight-average molecular weight falling within a range of from 100,000 to 3,000,000:

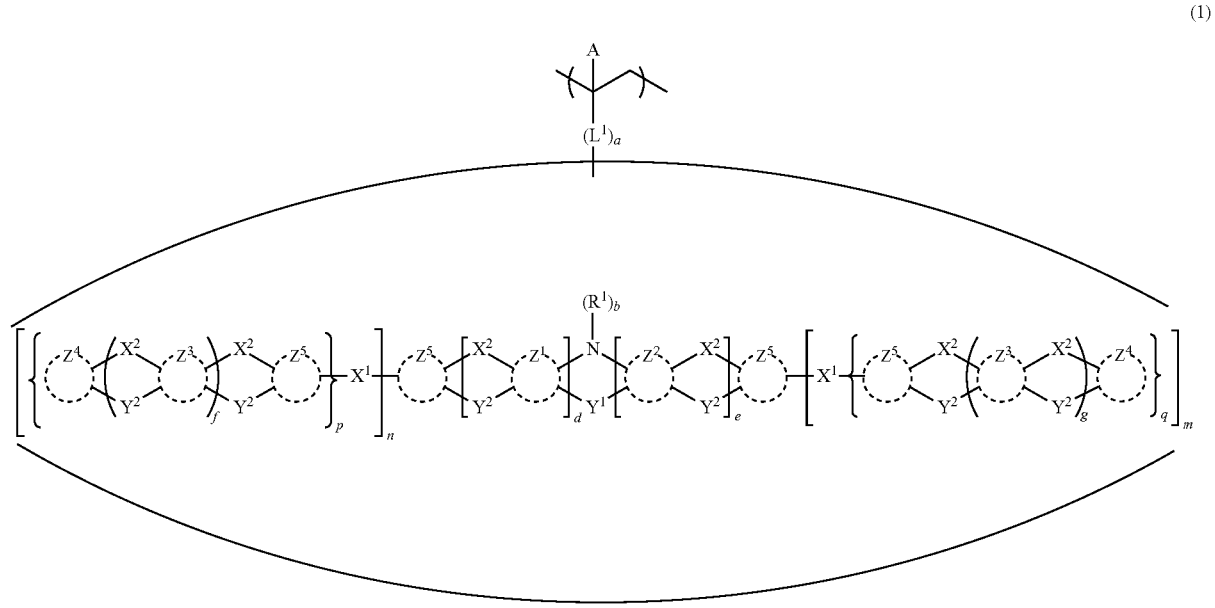

(1)

wherein the formula, A represents a hydrogen atom, or a substituted or unsubstituted alkyl group having a carbon number of from 1 to 10;

$X^1$ each independently represents a single bond, O (oxygen atom), S (sulfur atom), a substituted or unsubstituted alkylene group having a carbon number of from 1 to 20, a substituted or unsubstituted cycloalkylene group having a ring carbon atoms of from 3 to 16, a substituted or unsubstituted arylene group having a ring carbon atoms of from 6 to 50, a substituted or unsubstituted oxyalkylene group having a carbon number of from 1 to 20, a substituted or unsubstituted oxycycloalkylene group having a ring carbon atoms of from 3 to 16, a substituted or unsubstituted oxyarylene group having a ring carbon atoms of from 6 to 30, a substituted or unsubstituted aralkylene group having a carbon number of from 7 to 40, a substituted or unsubstituted heteroarylene group having a ring atoms of from 5 to 30, a substituted or unsubstituted alkylamino group, a substituted or unsubstituted arylamino group, or a substituted silylene group substituted with a substituent selected from alkyl and aryl;

$X^2$, $Y^1$ and $Y^2$ each independently represent a single bond, $CR^2_2$, $CR^2$, $NR^2$, N, O, S, or $SiR^2_2$;

$R^2$ represents a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group, provided that $R^2$ bonding to a nitrogen atom is not a hydrogen atom;

$Z^1$ to $Z^5$ each independently represent a substituted or unsubstituted aliphatic hydrocarbon cyclic group having a ring carbon atoms of from 3 to 30, a substituted or unsubstituted aliphatic heterocyclic group having a ring atoms of from 3 to 30, a substituted or unsubstituted aromatic hydrocarbon cyclic group having a ring carbon atoms of from 6 to 30, or a substituted or unsubstituted aromatic heterocyclic group having a ring atoms of from 5 to 30;

a, b, d, e, f, g, p, q, m and n each independently indicate an integer of from 0 to 5;

$R^1$ represents a single bond, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 50, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted or unsubstituted alkylamino group, a substituted or unsubstituted arylamino group, or a substituted silyl group substituted with a substituent selected from alkyl and aryl;

$L^1$ represents a single bond, a substituted or unsubstituted alkylene group having a carbon number of from 1 to 20, a substituted or unsubstituted cycloalkylene group having a ring carbon atoms of from 3 to 16, a substituted or unsubstituted arylene group having a ring carbon atoms of from 6 to 50, a substituted or unsubstituted oxyalkylene group having a carbon number of from 1 to 20, a substituted or unsubstituted oxycycloalkylene group having a ring carbon atoms of from 3 to 16, a substituted or unsubstituted oxyarylene group having a ring carbon atoms of from 6 to 30, a substituted or unsubstituted aralkylene group having a carbon number of from 7 to 40, a substituted or unsubstituted heteroarylene group having a ring atoms of from 5 to 30, a substituted or unsubstituted alkylamino group, a substituted or unsubstituted arylamino group, or a substituted silylene group substituted with a substituent selected from alkyl and aryl; and when $L^1$ and $R^1$ bond, the formula contains a repeating unit where a=0 and b=0.

(2) A copolymer comprising a repeating unit of the above formula (1) and a repeating unit of the following formula (2):

wherein A in the formula (2) is the same as A in the formula (1). c indicates an integer of from 0 to 5;

$L^2$ represents a single bond, a substituted or unsubstituted alkylene group having a carbon number of from 1 to 20, a substituted or unsubstituted cycloalkylene group having a ring carbon atoms of from 3 to 16, a substituted or unsubstituted arylene group having a ring carbon atoms of from 6 to 50, a substituted or unsubstituted oxyalkylene group having a carbon number of from 1 to 20, a substituted or unsubstituted oxycycloalkylene group having a ring carbon atoms of from 3 to 16, a substituted or unsubstituted oxyarylene group having a ring carbon atoms of from 6 to 30, a substituted or unsubstituted aralkylene group having a carbon number of from 7 to 40, a substituted or unsubstituted heteroarylene group having a ring atoms of from 5 to 30, or a substituted silylene group substituted with a substituent selected from alkyl and aryl;

$L^2$ is not a tricyclic or more polycyclic nitrogen-containing heteroarylene group;

$R^3$ represents a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted silyl group substituted with one or more substituents selected from alkyl and aryl, a halogen atom, a nitro group, a cyano group, or a hydroxyl group; $R^3$ is not a tricyclic or more polycyclic nitrogen-containing heteroaryl group; and when $R^3$ is a hydrogen atom, then $R^3$-$L^2$ represents a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 50, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted silyl group substituted with a substituent selected from alkyl and aryl, a halogen atom, a nitro group, a cyano group, or a hydroxyl group.

(3) The copolymer according to the above (1) or (2), wherein the formula (1) is represented by the following formula (3):

(5) The copolymer according to any of the above (1) to (4), wherein the formula (1) is represented by the following formula (4) or (5):

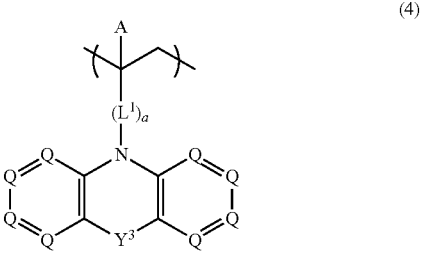

(4)

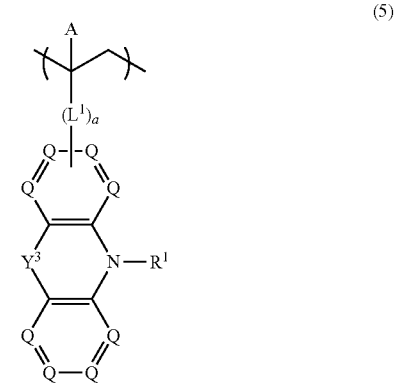

(5)

(3)

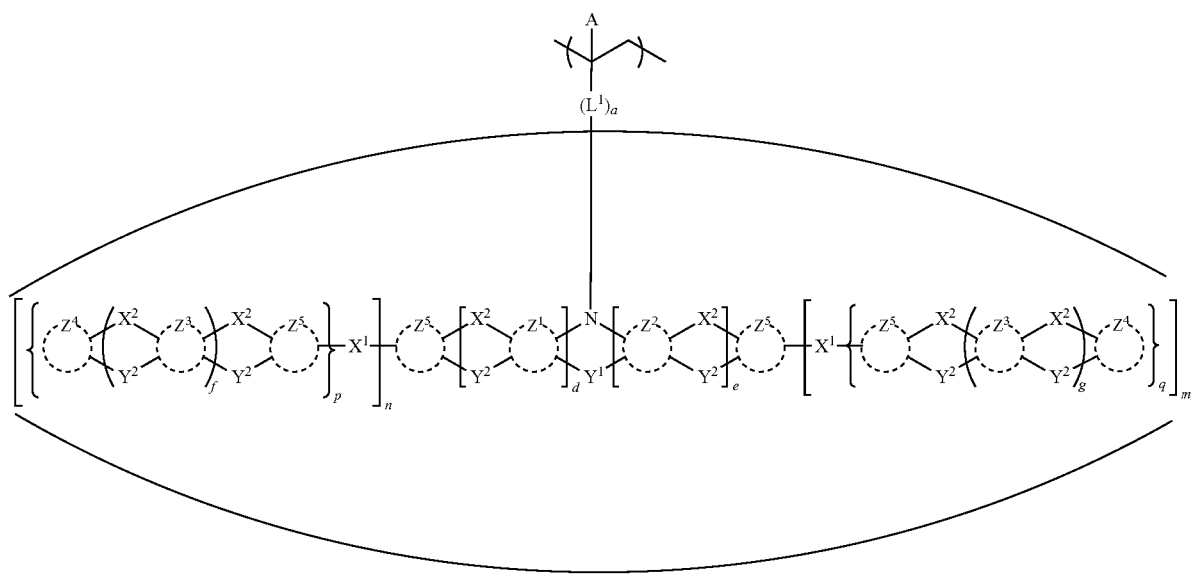

wherein A, $X^1$, $X^2$, $Y^1$, $Y^2$, $Z^1$ to $Z^5$, $L^1$, a, d, e, f, g, p, q, m and n each are independently the same as in the formula (1).

(4) The copolymer according to the above (2) or (3), wherein in the formula (2), c is 0, and $R^3$ is a substituted or unsubstituted aryl group having a ring carbon atoms of from 6 to 30, or a substituted or unsubstituted heteroaryl group having a ring atoms of from 2 to 30.

wherein A, $L^1$, $R^1$, $R^2$ and a each are independently the same as in the formula (1); and $Y^3$ represents a single bond, $CR^2$, N, O or S. Q represents $CR^2$ or N.

(6) The copolymer according to any of the above (1) to (5), wherein the formula (1) is represented by the following formula (6) or (7):

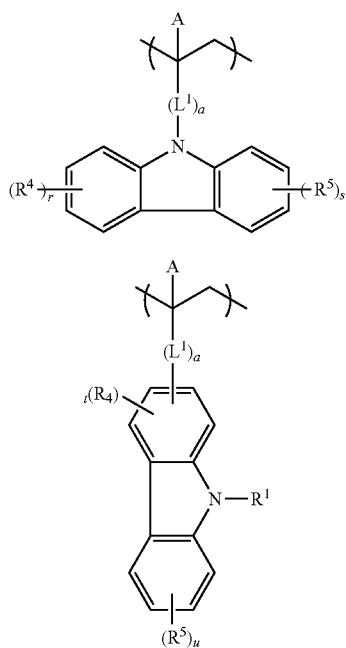

wherein A, $L^1$, $R^1$ and a are the same as in the formula (1); t indicates an integer of from 0 to 3, and r, s and u each indicate an integer of from 0 to 4; and $R^4$ and $R^5$ each independently represent a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group.

(7) A material for organic electronic devices comprising the copolymer according to any of the above (1) to (6).

(8) A material for organic electroluminescent devices comprising the copolymer according to any of the above (1) to (6).

(9) A solution comprising the copolymer according to any of the above (1) to (6) and a solvent.

(10) An organic electroluminescent device using the material for organic electroluminescent devices according to the above (8).

Advantageous Effects of Invention

The copolymer of the present invention has not only charge transporting properties but also solubility, and is suitable to an electronic device material, especially an organic EL device material for use in a coating method, and may form a film necessary for organic EL devices according to a coating method.

DESCRIPTION OF EMBODIMENTS

Figure 1:
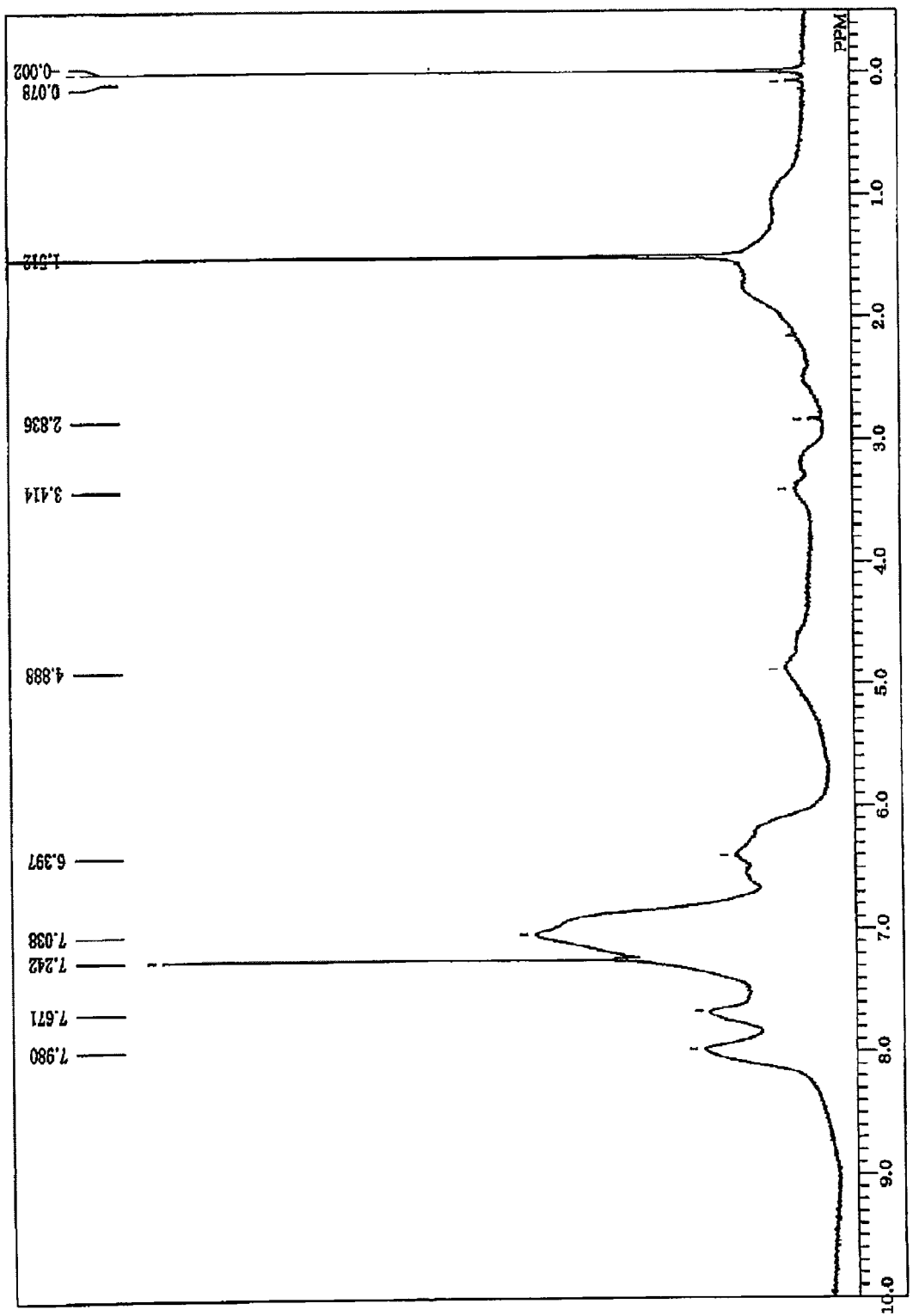
FIG. 1 This is a view showing the $^1$H NMR data of the copolymer produced in Example 1.

1. The copolymer of the above (1) is a copolymer that contains a repeating unit composed of a main chain part, a linking group and a nitrogen-containing condensed hetero ring, and the copolymer of the type contains the repeating unit where a is 0 and the repeating unit where a is from 1 to 5 and has a weight-average molecular weight (Mw) falling within a range of from 100,000 to 3,000,000.

The copolymer has solubility and charge transporting properties, and can be therefore used as a material for electronic devices including organic EL devices, organic thin-film solar cells and organic thin-film transistors. In particular, the copolymer is useful as a material for organic electronic devices to be produced using coating method.

The copolymer has different repeating units, and therefore the charge transporting characteristics thereof can be controlled.

In addition, the weight-average molecular weight of the copolymer is from 100,000 to 3,000,000 and is high, and therefore when the copolymer forms a solution thereof, the resultant solution can have a suitable viscosity.

When the molecular weight distribution (Mw/Mn) of the copolymer is 2 or more, the copolymer may not require any precision control of polymerization condition and is therefore preferable in point of improving the productivity thereof.

2. The copolymer of the above (2) is a copolymer containing a repeating unit of the above formula (1) (where a is from 0 to 5) and a repeating unit of the formula (2).

Having the repeating unit of the formula (2), the latitude of the substituent to be introduced into the side chain of the copolymer is broadened and therefore the charge transportability of the copolymer is easy to control. In addition, the hole transporting properties and the electron transporting properties of the copolymer may also be controlled. Selecting $R^3$ may make it possible to impart bipolarity to the copolymer.

3. The copolymer of the above (3) is a copolymer that has, in the repeating unit represented by the formula (1), an indispensable structure bonding to the main chain via N of the condensed ring composed of $Z^5$, N, $Y^1$ and $Z^5$ (formula (3)).

Containing the repeating unit of the formula (3), the copolymer contains a repeating unit similar to poly(N-vinylcarbazole) and therefore secures the possibility that the hole transportability thereof may be improved more. In addition, the energy gap between the ground state and the lowest excited singlet state or the lowest excited triplet state of the copolymer is large, and therefore there is a possibility that the copolymer can be broadly used as a material for organic electronic devices (hereinafter this may be abbreviated to an electronic material).

4. The copolymer of the above (4) is a copolymer represented by the formula (2) where c is 0 and $R^3$ is an aryl group or a heteroaryl group.

5. The copolymer of the above (5) is a copolymer represented by the formula (1) where the side chain structure is limited to a tricyclic nitrogen-containing heteroaryl group. Having the carbazole ring, the copolymer may have an increased energy gap between the ground state and the lowest excited singlet state or the lowest excited triplet state and therefore enjoys the possibility of wide-range use thereof as an electronic material.

6. The copolymer of the above (6) is a copolymer represented by the formula (1) where the side chain is limited to a carbazole (in which the benzene ring to form the carbazole may have a substituent).

The main chain of the copolymer of one embodiment of the present invention has a structure of —CHA-CH$_2$—, and the structure is formed through cleavage of the monomer having a vinyl group during polymerization. The copolymer uses a so-called vinyl monomer as the starting material, and therefore has an advantage of easy production thereof through radical polymerization or the like.

The groups constituting the above formulae (1) and (2) are described below.

In this description, "hydrogen atom" includes isotopes having a different number of neutrons, or that is, protium, deuterium and tritium. This interpretation shall apply to all hydrogen atoms existing in the copolymers of all embodiments of the present invention.

In this description, in the expression of "a substituted or unsubstituted XX group having a carbon number of from a to b" (including all expressions that are substantially the same as the above), "the carbon number of from a to b" does not include the carbon number of the substituent in the case where the XX group is substituted.

The substituted or unsubstituted alkyl group having a carbon number of from 1 to 10 that constitutes A includes, for example, a methyl group, an ethyl group, an n-propyl group, an isopropyl group, an n-butyl group, an isobutyl group a sec-butyl group, a tert-butyl group, an n-pentyl group, an n-hexyl group, an n-heptyl group, an n-octyl group, an n-nonyl group, an n-decyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a 2-ethylhexyl group, etc. Preferred is an alkyl group having a carbon number of from 1 to 10. Concretely, there are mentioned a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, a 2-ethylhexyl group.

From the viewpoint of the easy availability and the easiness in monomer production, A is especially preferably a hydrogen atom.

$R^1$ is a protective group for the nitrogen atom, and when bonding to $L^1$, this serves as a linking group and exhibits the same function as $L^1$. $R^1$ is selected from a single bond, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 50, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted or unsubstituted alkylamino group, a substituted or unsubstituted arylamino group, or a substituted silyl group substituted with a substituent selected from alkyl and aryl, and may have a structure of a combination of these. Of those, preferred is a substituted or unsubstituted aryl group having a ring carbon atoms of from 6 to 50 or a substituted or unsubstituted heteroaryl group having a ring atoms of from 5 to 30, from the viewpoint of the charge transporting properties.

$L^1$ is a group useful for control of the carrier transportability of the copolymer, except in the case where it is a single bond.

$L^1$ is selected from a single bond, a substituted or unsubstituted alkylene group having a carbon number of from 1 to 20, a substituted or unsubstituted cycloalkylene group having a ring carbon atoms of from 3 to 16, a substituted or unsubstituted arylene group having a ring carbon atoms of from 6 to 50, a substituted or unsubstituted oxyalkylene group having a carbon number of from 1 to 20, a substituted or unsubstituted oxycycloalkylene group having a ring carbon atoms of from 3 to 16, a substituted or unsubstituted oxyarylene group having a ring carbon atoms of from 6 to 30, a substituted or unsubstituted aralkylene group having a carbon number of from 7 to 40, a substituted or unsubstituted heteroarylene group having a ring atoms of from 5 to 30, a substituted or unsubstituted alkylamino group, a substituted or unsubstituted arylamino group, or a substituted silylene group substituted with a substituent selected from alkyl and aryl, and may have a structure of a combination of these. Of those, preferred are a substituted or unsubstituted arylene group having a ring carbon atoms of from 6 to 50, a substituted or unsubstituted heteroarylene group having a ring atoms of from 5 to 30, and a combination of these, from the viewpoint of the charge transporting properties.

The substituted or unsubstituted alkyl group and alkylene group having a carbon number of from 1 to 20 for the above-mentioned $R^1$ and $L^1$ include the alkyl groups described for A hereinabove and alkylene groups derived from such alkyl groups by converting them into divalent groups. Preferred groups are also the same as above.

The substituted or unsubstituted cycloalkyl group and cycloalkylene group having a ring carbon atoms of from 3 to 16 for the above-mentioned $R^1$ and $L^1$ include, for example, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a 1-adamantyl group, a 2-adamantyl group, a 1-norbornyl group, a 2-norbornyl group, and those derived from these groups by removing one hydrogen atom bonding to the ring carbon thereof. Preferred are a cyclopentyl group, a cyclohexyl group, a cyclopentylene group, a cyclohexylene group. As the substituent, there are mentioned an alkyl group having a carbon number of from 1 to 10 such as a methyl group, an ethyl group, etc., and a halogen atom.

As the substituted or unsubstituted aryl group and arylene group having a ring carbon atoms of from 6 to 30 for the above-mentioned $R^1$ and $L^1$, concretely mentioned are the aryl groups to be listed below and the divalent arylene groups derived from those aryl groups. The aryl groups and the arylene groups include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a biphenyl-2-yl group, a biphenyl-3-yl group, a biphenyl-4-yl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl-4-yl group, a 4"-t-butyl-p-terphenyl-4-yl group, a fluoren-1-yl group, a fluoren-2-yl group, a fluoren-3-yl group, a fluoren-4-yl group, etc. Preferred are a phenyl group, a naphthyl group, an anthryl group, a biphenyl group, a p-terphenyl group, a tolyl group, a fluorenyl group, a phenylene group, a naphthylene group, an anthracenylene group, a biphenylene group, a p-terphenylene group, a tolylene group, a fluorenylene group.

As the substituent for these groups, there are mentioned an alkyl group having a carbon number of from 1 to 10, a halogen atom, a heteroaryl group such as a carbazolyl group, a dibenzofuranyl group, a dibenzothiophenyl group, etc.; an aryl group such as a 9,9-dioctylfluorenyl group, etc.; a diarylamino group such as a diphenylamino group, etc.; and a cyano group.

As the substituted or unsubstituted alkoxy group and oxyalkylene group having a carbon number of from 1 to 20 for the above-mentioned $R^1$ and $L^1$, there are mentioned groups in which an oxygen atom bonds to the end of the above-mentioned, substituted or unsubstituted alkyl groups and alkylene groups having a carbon number of from 1 to 20. The same shall apply to the preferred groups.

As the substituted or unsubstituted cycloalkoxy group and oxycycloalkylene group having a ring carbon atoms of from 3 to 16 for the above-mentioned $R^1$ and $L^1$, there are mentioned groups in which an oxygen atom bonds to the end of the above-mentioned, substituted or unsubstituted cycloalkyl groups and cycloalkylene groups having a carbon number of from 3 to 16. The same shall apply to the preferred groups.

As the substituted or unsubstituted aryloxy group and oxyarylene group having a ring carbon atoms of from 6 to 30 for the above-mentioned $R^1$ and $L^1$, there are mentioned groups in which an oxygen atom bonds to the end of the above-mentioned, substituted or unsubstituted aryl groups and arylene groups having a ring carbon atoms of from 6 to 30. The same shall apply to the preferred groups.

As the substituted or unsubstituted aralkyl group and aralkylene group having a carbon number of from 7 to 40 for the above-mentioned $R^1$ and $L^1$, there are mentioned the above-mentioned alkyl groups and alkylene groups to which an aryl group or an arylene group bond. The preferred groups of the two, as combined, may be the preferred groups of those groups.

As the substituted or unsubstituted heteroaryl group and heteroarylene group having a ring atoms of from 5 to 30 for the above-mentioned $R^1$ and $L^1$, concretely mentioned are the heteroaryl groups to be listed below and the divalent heteroarylene groups derived from those heteroaryl groups. The heteroaryl groups and the heteroarylene groups include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-dibenzofuranyl group, a 4-dibenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a, 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl) pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, a 2-thienyl group, a 3-thienyl group, a 2-benzothiophenyl group, a 3-thiophenyl group, a 4-thiophenyl group, a 5-thiophenyl group, a 6-thiophenyl group, a 7-thiophenyl group, a 1-isothiophenyl group, a 3-isothiophenyl group, a 4-isothiophenyl group, a 5-isothiophenyl group, a 6-isothiophenyl group, a 7-isothiophenyl group, a 2-dibenzothiophenyl group, a 4-dibenzothiophenyl group, etc.

The substituent for these groups includes an aryl group such as a phenyl group, a 9,9-dimethylfluorenyl group, a 9,9-dioctylfluorenyl group, etc., a heteroaryl group such as a pyridyl group, a pyrimidyl group, a dibenzofuranyl group, etc., an alkyl group having from 1 to 10 carbon atoms, a halogen atom, a cyano group, and their combinations.

Preferred are a 1-pyrrolyl group, a 2-pyrrolyl group, a 3-pyrrolyl group, a 2-dibenzofuranyl group, a 4-dibenzofuranyl group, a 2-dibenzothiophenyl group, a 4-dibenzothiophenyl group, a 2,2-bipyridin-4-yl group, a 2,2-bipyridin-6-yl group, a 2,2':2',2''-terpyridin-4'-yl group, a 2,2':6'2''-terpyridin-4'-phenyl-4-yl group, a benzothiazol-4-yl group, a benzothiazol-5-yl group, a trans-stilben-4-yl group, a 2,2'-bithiophen-3-yl group, a 2,2'-bithiophen-5-yl group, a 3,4-ethylenedioxythiophen-2-yl group, a 7-(2-thienyl)-2,1,3-benzothiadiazol-4-(2-thienyl-5-yl) group, and divalent heteroarylene groups derived from those groups. In addition, also preferred are a pyridyl group, a pyrimidyl group, a quinolyl group, a furanyl group, a thiophenyl group, a benzimidazolyl group, and divalent heteroarylene groups derived from those groups.

As to the substituted or unsubstituted alkylamino group for the above-mentioned $R^1$ and $L^1$, there are a case where the group bonds to the main chain and the side chain via the alkyl group bonding to the nitrogen atom, a case where the group bonds thereto via the nitrogen atom and the alkyl group bonding thereto, and a case where the dialkylamino group bonds to the nitrogen atom of the side chain. In all of those cases, the preferred examples of the alkyl group include those described hereinabove as the preferred groups of the alkyl or alkylene group having a carbon number of from 1 to 20.

As to the substituted or unsubstituted arylamino group for the above-mentioned $R^1$ and $L^1$, there are a case where the group bonds to the main chain and the side chain via the aryl group bonding to the nitrogen atom, a case where the group bonds thereto via the nitrogen atom and the aryl group bonding thereto, and a case where the diarylamino group bonds to the nitrogen atom of the side chain. In all of those cases, the preferred examples of the aryl group include those described hereinabove as the preferred groups of the aryl or arylene group having a ring carbon atoms of from 6 to 30.

For the alkyl group and the aryl group in the substituted silyl or silylene group substituted with a substituent selected from alkyl and aryl for the above-mentioned $R^1$ and $L^1$, referred to are those mentioned hereinabove for the above-mentioned alkyl group having a carbon number of from 1 to 20 or the above-mentioned aryl group having a ring carbon atoms of from 6 to 30.

The side chain in the formula (1) (parenthesized structure) is formed of a residue of a nitrogen-containing condensed hetero ring. The nitrogen-containing condensed hetero ring is formed of a tricyclic or more polycyclic condensed ring, in which the center ring is a nitrogen-containing hetero ring. The side chain bonds to $L^1$ or the main chain via the carbon atom or the nitrogen atom constituting the center ring or the other ring than the center ring, or via the atom constituting $X^1$.

In the formula (1), $X^2$, $Y^1$ and $Y^2$ each independently represent a single bond, $NR^2$, $CR^2_2$, $CR^2$, $SiR^2_2$, O (oxygen atom) or S (sulfur atom).

$R^2$ represents a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group. $R^2$ bonding to a nitrogen atom is not a hydrogen atom.

As the substituted or unsubstituted alkyl group having a carbon number of from 1 to 20, there are mentioned the groups described hereinabove for the above-mentioned A, and also mentioned are those described hereinabove as the preferred groups.

The substituted or unsubstituted cycloalkyl group having a ring carbon atoms of from 3 to 16 includes, for example, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a 1-adamantyl group, a 2-adamantyl group, a 1-norbornyl group, a 2-norbornyl group. Preferred are a cyclopentyl group and a cyclohexyl group. The substituent includes an alkyl group having a carbon number of from 1 to 10 such as a methyl group, an ethyl group, etc., and a halogen atom.

As the substituted or unsubstituted aryl group having a ring carbon atoms of from 6 to 30, for example, there are mentioned those described hereinabove for the above-mentioned $R^1$.

The substituted or unsubstituted alkoxy group having a carbon number of from 1 to 20 is represented by —$OY_1$. As examples of $Y_1$, there are mentioned those mentioned for the above-mentioned alkyl group. The alkoxy group includes, for example, a methoxy group, an ethoxy group, etc.

The substituted or unsubstituted cycloalkoxy group having a ring carbon atoms of from 3 to 16 is represented by —$OY_1$. As examples of $Y_1$, there are mentioned those mentioned for the above-mentioned cycloalkyl group. The cycloalkoxy group includes, for example, a cyclopentyloxy group and a cyclohexyloxy group.

The substituted or unsubstituted aryloxy group having a ring carbon atoms of from 6 to 30 is represented by —$OY_1$. As examples of $Y_1$, there are mentioned those mentioned for the above-mentioned aryl group. The aryloxy group includes, for example, a phenoxy group.

The substituted or unsubstituted aralkyl group having a carbon number of from 7 to 40 is represented by —$Y_1$—Z. As examples of $Y_1$, there are mentioned divalent alkylene groups derived from the above-mentioned alkyl groups; and as examples of Z, there are mentioned the aryl groups exemplified hereinabove. The ring carbon atoms of the aryl moiety in the aralkyl group is preferably from 6 to 30. The carbon number of the alkyl moiety is preferably from 1 to 10, particularly preferably from 1 to 6. For example, there are mentioned a benzyl group, a phenylethyl group and a 2-phenylpropan-2-yl group.

As the substituted or unsubstituted heteroaryl group having a ring atoms of from 5 to 30, for example, there are mentioned the heteroaryl groups described hereinabove for $R^1$. The heteroaryl group further includes a 2-carbazolyl group, a 3-carbazolyl group, a 4-carbazolyl group, a 9-carbazolyl group, a 1-acridinyl group, a 2-acridinyl group, a 3-acridinyl group, a 4-acridinyl group, a 9-acridinyl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group and a 10-phenoxazinyl group.

As the substituted or unsubstituted alkylamino group and the substituted or unsubstituted arylamino group, there are mentioned substituted or unsubstituted dialkylamino groups, or substituted or unsubstituted diarylamino groups. Preferably, the carbon number of the alkyl moiety is from 1 to 20. Examples of the alkyl group bonding to the nitrogen atom include those of the above-mentioned alkyl group. Preferably, the ring carbon atoms of the aryl moiety is from 6 to 30. Examples of the aryl group bonding to the nitrogen atom include those of the above-mentioned aryl group.

The substituted silyl group substituted with one or more substituents selected from alkyl and aryl includes silyl groups substituted with alkyl and/or aryl. Examples of the alkyl group and the aryl group bonding to the silicon atom include those of the above-mentioned aryl group and the alkyl group. The alkyl groups with which the silyl group is substituted may be the same or different. Similarly, the aryl groups with which the silyl group is substituted may be the same or different. Concretely, as the trialkylsilyl group, there are mentioned a trimethylsilyl group, a vinyldimethylsilyl group, a triethylsilyl group, a tripropylsilyl group, a propyldimethylsilyl group, a tributylsilyl group, a t-butyldimethylsilyl group, a tripentylsilyl group, a triheptylsilyl group, a trihexylsilyl group, etc. Preferred are a trimethylsilyl group and a triethylsilyl group.

As the triarylsilyl group, there are mentioned a triphenylsilyl group, a trinaphthylsilyl group, etc. Preferred is a triphenylsilyl group. As the alkylarylsilyl group, there are mentioned a dimethylphenylsilyl group, a diethylphenylsilyl group, a diphenylmethylsilyl group, an ethyldiphenylsilyl group, etc. Preferred are a diphenylmethylsilyl group and an ethyldiphenylsilyl group.

The halogen atom includes a fluorine atom, a chlorine atom and a bromine atom.

$Z^1$, $Z^2$, $Z^3$, $Z^4$ and $Z^5$ represent a substituted or unsubstituted aliphatic hydrocarbon cyclic group having a ring carbon atoms of from 3 to 30, a substituted or unsubstituted aliphatic heterocyclic group having a ring atoms of from 3 to 30, a substituted or unsubstituted aromatic hydrocarbon cyclic group having a ring carbon atoms of from 6 to 30, or a substituted or unsubstituted aromatic heterocyclic group having a ring atoms of from 5 to 30. Of those, preferred is a substituted or unsubstituted aromatic hydrocarbon cyclic group having a ring carbon atoms of from 6 to 30, or a substituted or unsubstituted aromatic heterocyclic group having a ring atoms of from 5 to 30, from the viewpoint of the charge transportability.

The substituted or unsubstituted aliphatic hydrocarbon cyclic group having a ring carbon atoms of from 3 to 30 includes, for example, groups derived from cyclopropane, cyclobutane, cyclopentane, cyclohexane, methylcyclopentane, methylcyclohexane, ethylcyclohexane, fluorocyclohexane, adamantane and norbornane. Preferred are groups derived from cyclopentane and cyclohexane. As the substituent, there are mentioned an alkyl group having a carbon number of from 1 to 10, such as a methyl group, an ethyl group, an n-butyl group, an n-hexyl group, an n-octyl group, etc., a halogen atom, an aryl group such as a phenyl group, a naphthyl group, etc., a heteroaryl group such as a carbazolyl group, a thiophenyl group, a furyl group, a pyrimidyl group, a triazinyl group, etc., and a cyano group. In case where the substituent is a nitrogen-containing group such as a carbazolyl group or the like, the nitrogen atom preferably bonds to a phenyl group, a methyl group or the like from the viewpoint of the stability of the copolymer. In case where the substituent is a pyrimidyl group, a triazinyl group or the like, a phenyl group or the like may bond to the ring carbon atom.

The substituted or unsubstituted aliphatic heterocyclic group having a ring atoms of from 5 to 30 includes, for example, groups derived from pyrrolidine and piperidine. As the substituent, there are mentioned an alkyl group having a carbon number of from 1 to 10, such as a methyl group, an ethyl group, an n-butyl group, an n-hexyl group, an n-octyl group, etc., a halogen atom, an aryl group such as a phenyl group, a naphthyl group, etc., a heteroaryl group such as a carbazolyl group, a thiophenyl group, a furyl group, a pyrimidyl group, a triazinyl group, etc., and a cyano group. In case where the substituent is a nitrogen-containing group such as a carbazolyl group or the like, the nitrogen atom preferably bonds to a phenyl group, a methyl group or the like from the viewpoint of the stability of the copolymer. In case where the substituent is a pyrimidyl group, a triazinyl group or the like, a phenyl group or the like may bond to the ring carbon atom.

The substituted or unsubstituted aromatic hydrocarbon cyclic group having a ring carbon atoms of from 6 to 30 includes, for example, groups derived from the aromatic hydrocarbon ring constituting the above-mentioned aryl group or arylene group. Preferred are groups derived from a benzene ring, a naphthalene ring, a phenanthrene ring, an anthracene ring and a fluorene ring. As the substituent, there are mentioned an alkyl group having a carbon number of from 1 to 10, such as a methyl group, an ethyl group, an n-butyl group, an n-hexyl group, an n-octyl group, etc., a halogen atom, an aryl group such as a phenyl group, a naphthyl group, etc., a heteroaryl group such as a carbazolyl group, a thiophenyl group, a furyl group, a pyrimidyl group, a triazinyl group, etc., and a cyano group. In case where the substituent is a nitrogen-containing group such as a carbazolyl group or the like, the nitrogen atom preferably bonds to a phenyl group, a methyl group or the like from the viewpoint of the stability. In case where the substituent is a pyrimidyl group, a triazinyl group or the like, a phenyl group or the like may bond to the ring carbon atom.

The substituted or unsubstituted aromatic heterocyclic group having a ring atoms of from 5 to 30 includes, for example, groups derived from the aromatic hetero ring constituting the heteroaryl group or the heteroarylene group for the above-mentioned $R^1$ and $L^1$. For example, there are mentioned groups derived from a pyridine ring, a pyrimidine ring, a triazine ring, a quinoline ring, an isoquinoline ring, a dibenzofuran ring, a carbazole ring, a quinazoline ring and a dibenzothiophene ring. As the substituent, there are mentioned an alkyl group having a carbon number of from 1 to 10, such as a methyl group, an ethyl group, an n-butyl group, an n-hexyl group, an n-octyl group, etc., a halogen atom, an aryl group such as a phenyl group, a naphthyl group, etc., a heteroaryl group such as a carbazolyl group, a thiophenyl group, a furyl group, a pyrimidyl group, a triazinyl group, etc., and a cyano group. In case where the substituent is a nitrogen-containing group such as a carbazolyl group or the like, the nitrogen atom preferably bonds to a phenyl group, a methyl group or the like from the viewpoint of the stability of the copolymer. In case where the substituent is a pyrimidyl group, a triazinyl group or the like, a phenyl group or the like may bond to the ring carbon atom.

Examples of the structure where d, e, f or g in the formula (1) is not 0, include an indolocarbazole ring, etc.

$X^1$ is a linking group for bonding the condensed ring formed of $Z^4$, $X^2$, $Y^2$ and $Z^5$, and the condensed ring formed of $Z^5$, N, $Y^1$ and $Z^5$. The condensed ring formed of $Z^5$, N, $Y^1$ and $Z^5$ bonds to $X^1$ at any of $Z^1$, N, $Y^1$, $Z^2$, $X^2$, $Y^2$ or $Z^5$.

$X^1$ represents a single bond, O (oxygen atom), S (sulfur atom), a substituted or unsubstituted alkylene group having a carbon number of from 1 to 20, a substituted or unsubstituted cycloalkylene group having a ring carbon atoms of from 3 to 16, a substituted or unsubstituted arylene group having a ring carbon atoms of from 6 to 50, a substituted or unsubstituted oxyalkylene group having a carbon number of from 1 to 20, a substituted or unsubstituted oxycycloalkylene group having a ring carbon atoms of from 3 to 16, a substituted or unsubstituted oxyarylene group having a ring carbon atoms of from 6 to 30, a substituted or unsubstituted aralkylene group having a carbon number of from 7 to 40, a substituted or unsubstituted heteroarylene group having a ring atoms of from 5 to 30, a substituted or unsubstituted alkylamino group, a substituted or unsubstituted arylamino group, or a substituted silylene group substituted with a substituent selected from alkyl and aryl. Of those, preferred is a single bond, a substituted or unsubstituted arylene group having a ring carbon atoms of from 6 to 50, or a substituted or unsubstituted heteroarylene group having a ring atoms of from 5 to 30, from the viewpoint of the charge transportability of the copolymer.

As specific examples of the above groups, there are mentioned those described for $L^1$ hereinabove.

In the formula (1), a, b, d, e, f, g, p, q, m and n each independently indicate an integer of from 0 to 5. Preferably, a is from 0 to 3. b is 1 when $R^1$ and $L^1$ do not bond. When $R^1$ and $L^1$ bond, b is preferably from 0 to 3, and more preferably, a+b is from 0 to 3. d and e each are preferably from 0 to 3, and d+e is preferably from 0 to 4. f and g each are preferably from 0 to 2. p and q each are preferably from 0 to 3, and m and n each are preferably from 0 to 3.

The residue of the nitrogen-containing condensed hetero ring (side chain group in the formula (1)) includes, for example, a 2-carbazolyl group, a 3-carbazolyl group, a 4-carbazolyl group, a 9-carbazolyl group, a 1-acridinyl group, a 2-acridinyl group, a 3-acridinyl group, a 4-acridinyl group, a 9-acridinyl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, and groups derived from those groups by partly substituting the carbon atoms of the benzene ring therein with a nitrogen atom.

The substituent bonding to the residue of the nitrogen-containing condensed hetero ring includes the above-mentioned $R^2$ and condensed rings formed of $Z^4$, $X^2$, $Y^2$ and $Z^5$. Preferred are a substituted or unsubstituted alkyl group having a carbon number of from 1 to 10, a substituted or unsubstituted aryl group having a ring carbon atoms of from 6 to 30, and a substituted or unsubstituted heteroaryl group having a ring atoms of from 5 to 30.

The alkyl group having a carbon number of from 1 to 10 includes, for example, those described hereinabove for the above-mentioned A. Preferred examples of the group are the same as above. The aryl group having a ring carbon atoms of from 6 to 30 includes, for example, those described hereinabove for the above-mentioned $R^4$ and $R^2$. Preferably, the group is a phenyl group. The heteroaryl group having a ring atoms of from 5 to 30 includes, for example, those described hereinabove for the above-mentioned $R^1$ and $R^2$. Preferably, the group is a carbazolyl group, a dibenzofuranyl group, or a dibenzothiophenyl group.

In the formula (2), A is the same as A in the formula (1), and specific examples and preferred examples of the former are also the same as those of the latter. c is an integer of from 0 to 5, and is preferably from 0 to 3.

In the formula (2), $L^2$ is selected from a single bond, a substituted or unsubstituted alkylene group having a carbon number of from 1 to 20, a substituted or unsubstituted cycloalkylene group having a ring carbon atoms of from 3 to 16, a substituted or unsubstituted arylene group having a ring carbon atoms of from 6 to 50, a substituted or unsubstituted oxyalkylene group having a carbon number of from 1 to 20, a substituted or unsubstituted oxycycloalkylene group having a ring carbon atoms of from 3 to 16, a substituted or unsubstituted oxyarylene group having a ring carbon atoms of from 6 to 30, a substituted or unsubstituted aralkylene group having a carbon number of from 7 to 40, a substituted or unsubstituted heteroarylene group having a ring atoms of from 35 to 30, or a substituted silylene group substituted with a substituent selected from alkyl and aryl, and may be a structure comprising a combination of these. Of those, preferred is a substituted or unsubstituted arylene group having a ring carbon atoms of from 6 to 50, a substituted or unsubstituted heteroarylene group having a ring atoms of from 5 to 30, or a combination thereof, from the viewpoint of the charge transporting properties.

Of the above, the others than the substituted or unsubstituted heteroarylene group having a ring atoms of from 5 to 30 are the same as those described for the above-mentioned $L^1$.

The heteroarylene group is the same as that described for the above-mentioned $L^1$, but not including a tricyclic or more polycyclic nitrogen-containing heteroarylene group.

In the formula (2), $R^3$ represents a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted silyl group substituted with one or more substituents selected from alkyl and aryl, a halogen atom, a nitro group, a cyano group, or a hydroxyl group.

Of the above, the others than the substituted or unsubstituted heteroaryl group having a ring atoms of from 5 to 30 are the same as those described for the above-mentioned $R^1$ and $R^2$.

The heteroaryl group is the same as that described for the above-mentioned $R^1$ and $R^2$, but not including a tricyclic or more polycyclic nitrogen-containing heteroaryl group.

$R^3$ is preferably a group exhibiting electron transportability or solubility.

The group exhibiting electron transportability includes a pyridyl group, a pyrimidyl group, a triazyl group.

The group also includes a phenalenyl group, a biphenylyl group, a terphenylyl group.

The group contributing toward solubility includes an alkyl group having a carbon number of from 3 to 20.

Further, the group includes a condensed aromatic hydrocarbon group such as a naphthacenyl group, an acenaphthyl group, a pyrenyl group, a phenanthryl group, a triphenylenyl group, etc., and an aza-heteroaryl group such as an azadibenzofuranyl group, an azadibenzothiophenyl group, etc.

When $R^3$ is a hydrogen atom in the formula (2), then $R^3$-$L^2$ in the formula (2) represents a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 50, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted silyl group substituted with a substituent selected from alkyl and aryl.

Preferred is a substituted or unsubstituted aryl group having a ring atoms of from 6 to 50, or a substituted or unsubstituted heteroaryl group having a ring atoms of from 5 to 30.

Specific examples of these groups are the same as those described for the above-mentioned $R^1$ and $R^2$.

In the formula (4) and the formula (5), $Y^3$ represents a single bond, $CR^2$, N, O or S, and $R^1$ is the same as in the formula (1). Q represents N or $CR^2$, and $R^2$ is the same as in the formula (1).

In the formula (6) and the formula (7), $R^4$ and $R^5$ each independently represent a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 16, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 5 to 30, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group.

Specific examples of these groups are the same as those described for the above-mentioned $R^2$.

Examples of the monomers to form the repeating units of the formulae (1) to (7) are shown below, to which, however, the present invention is not limited.

Examples of the monomers of the formula (1) where a=0 are shown below.

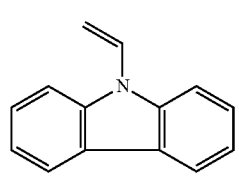
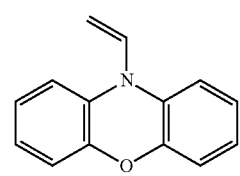

-continued

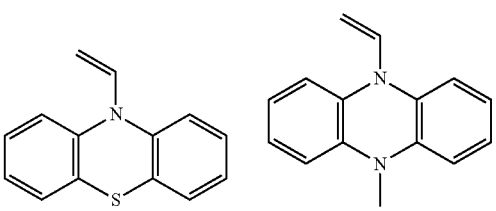

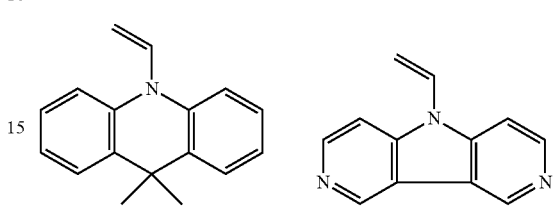

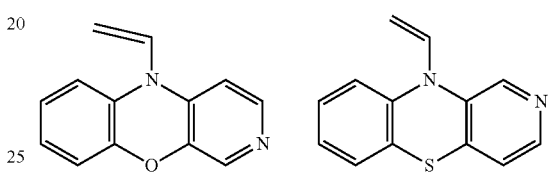

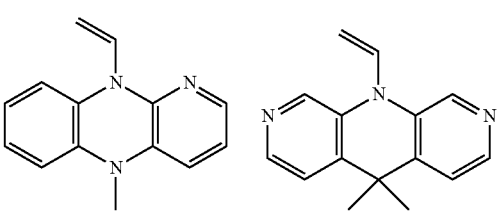

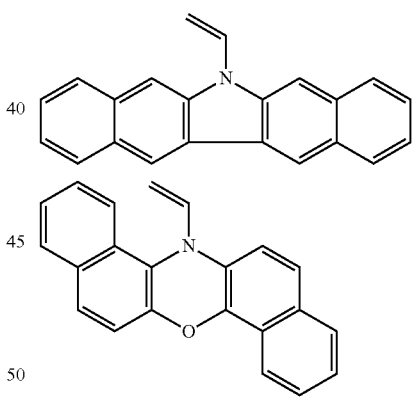

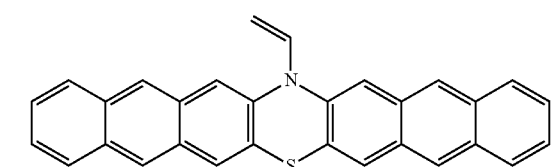

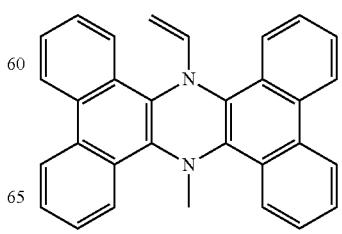

-continued
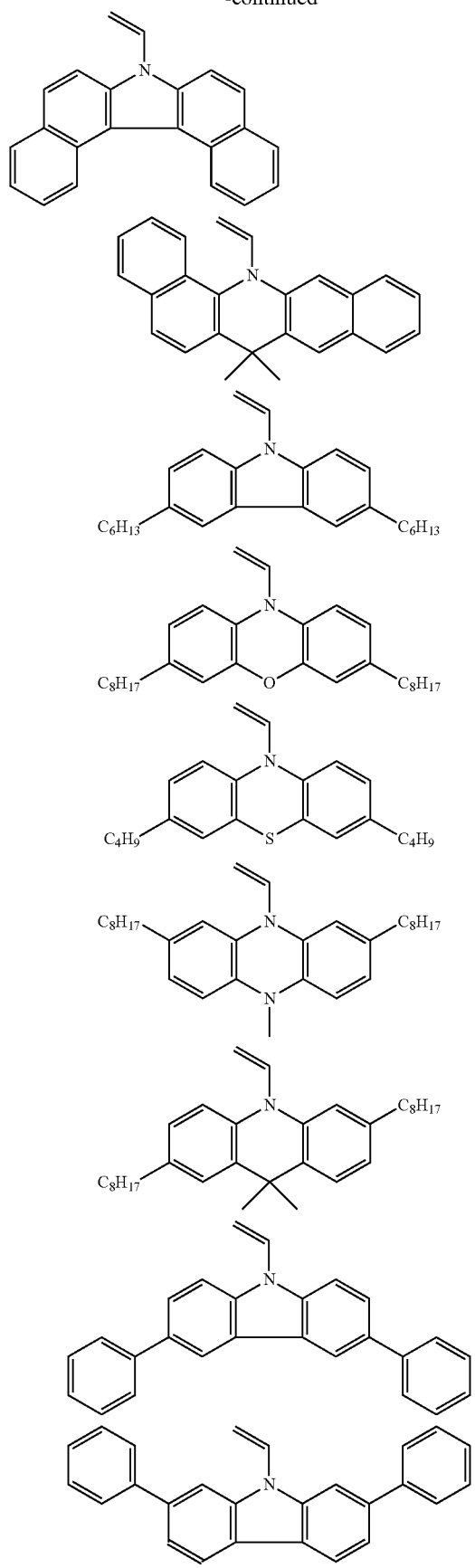
-continued
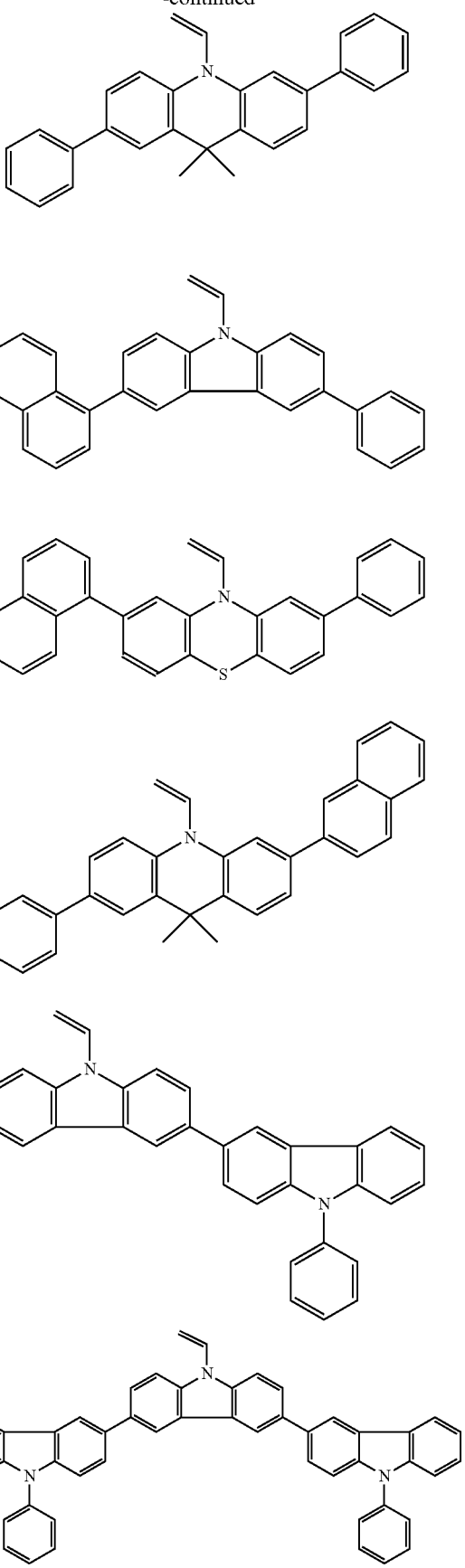

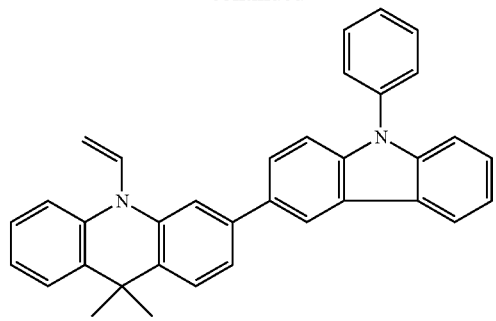
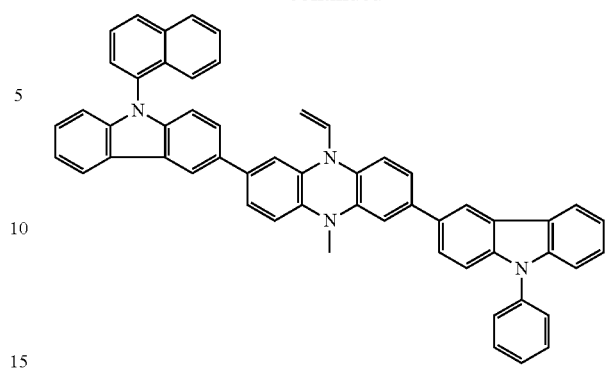
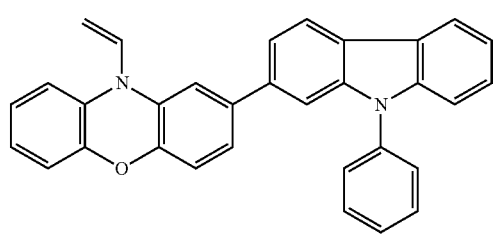
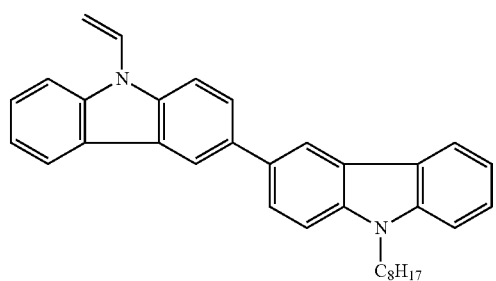
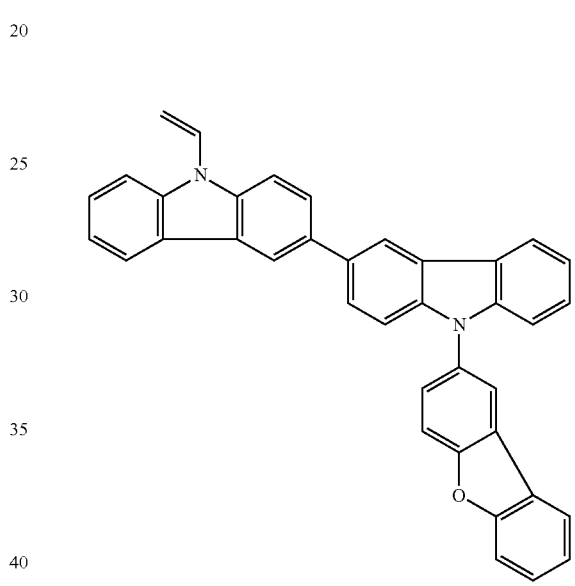
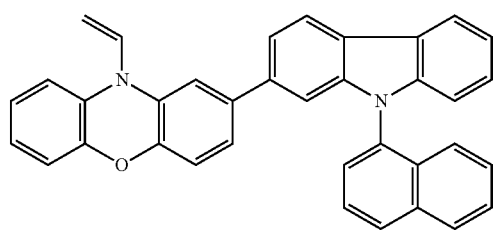
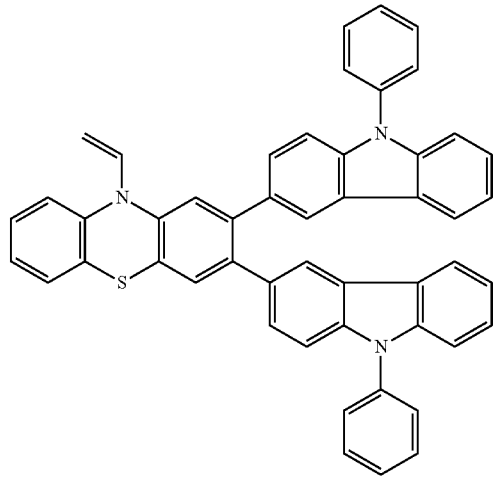
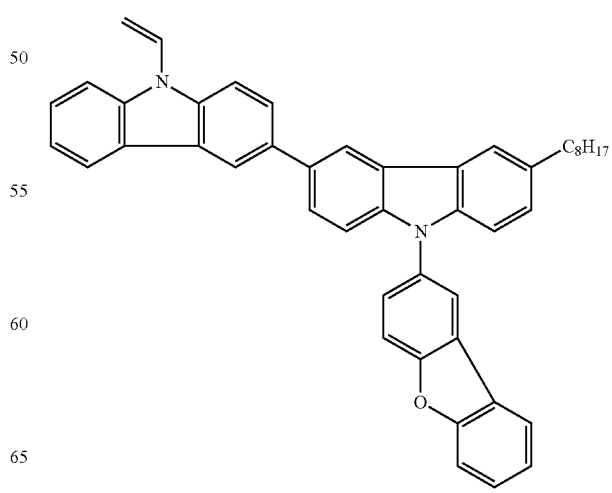

25
-continued
26
-continued
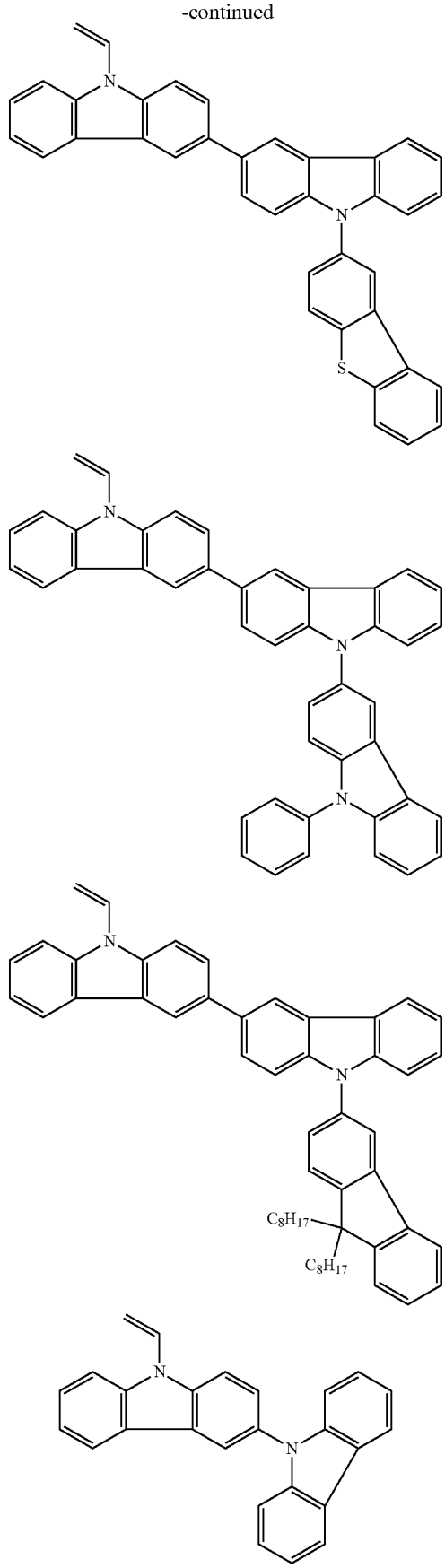
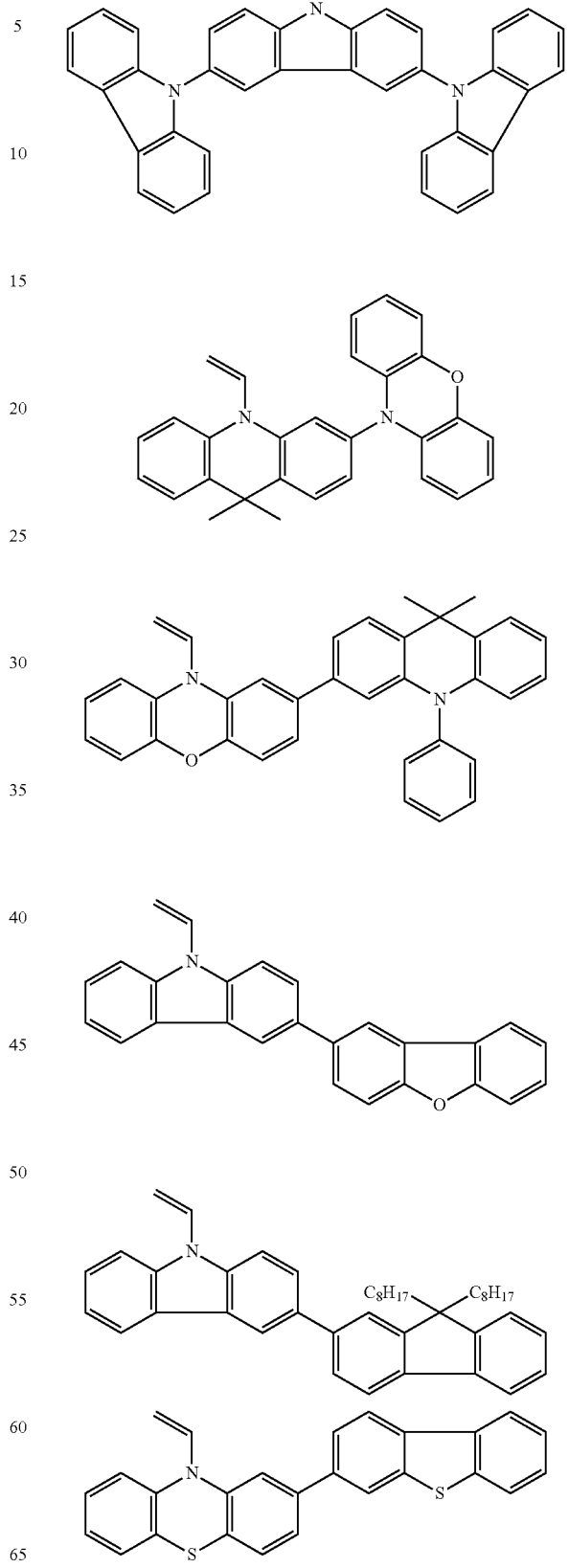

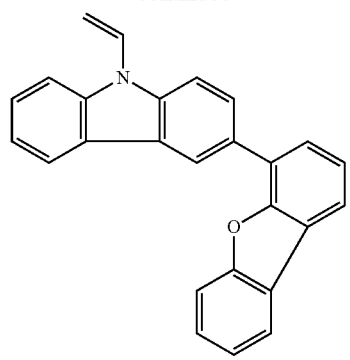
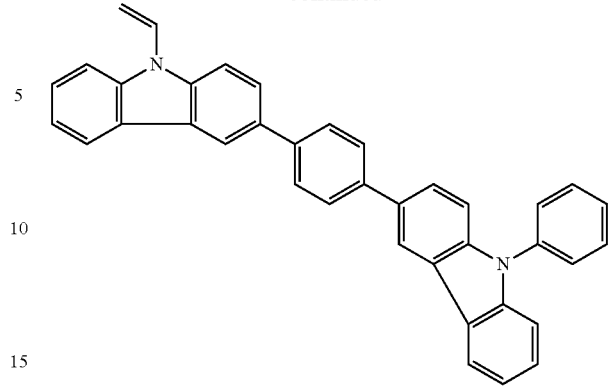
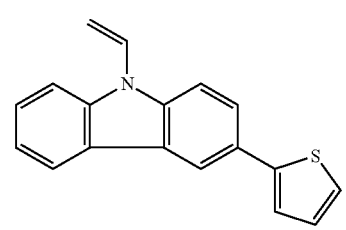
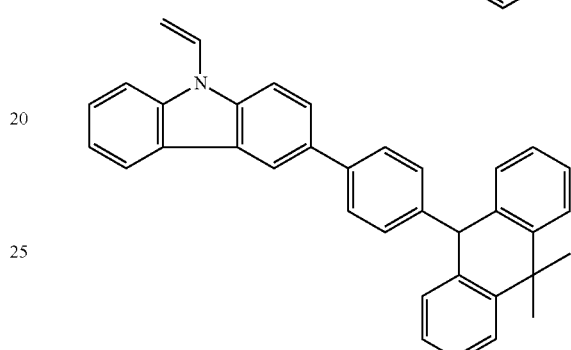
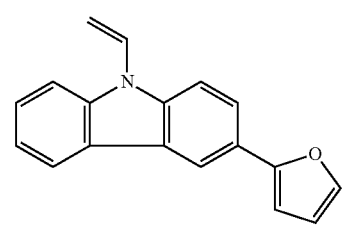
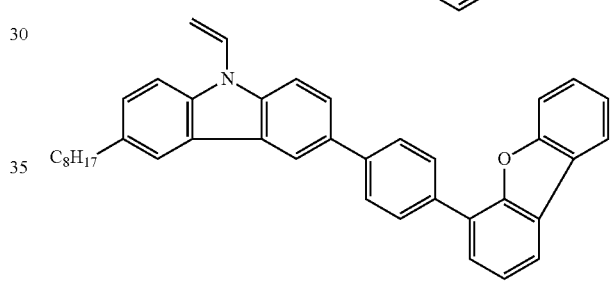
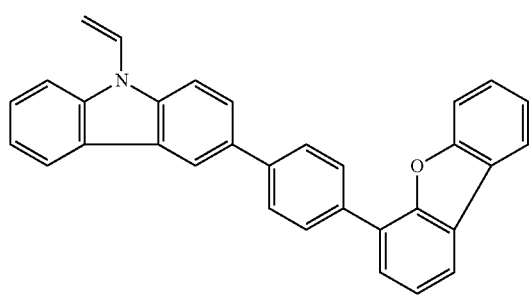
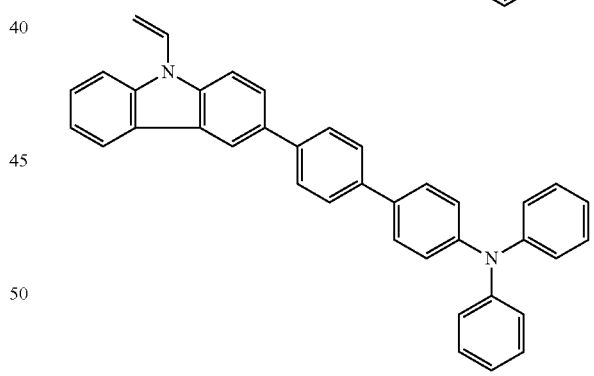
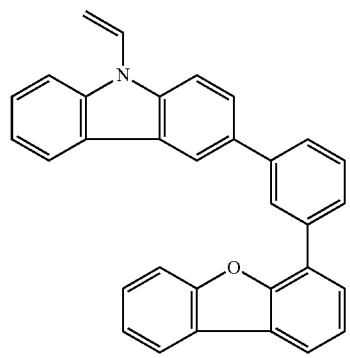
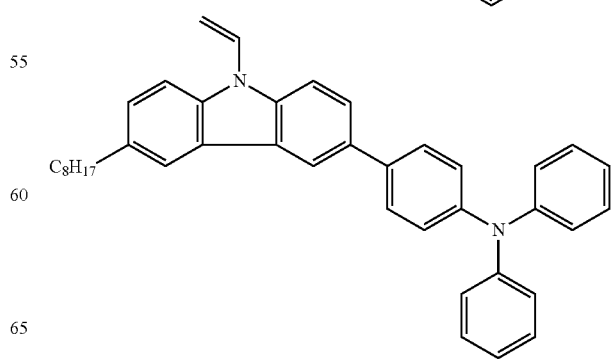

29
-continued
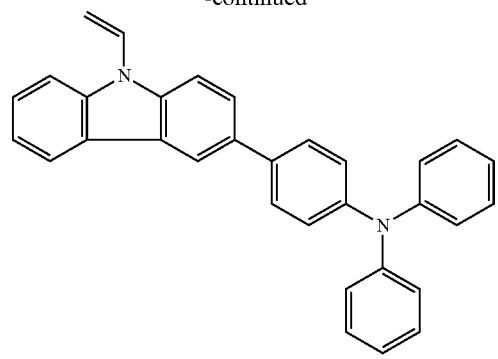
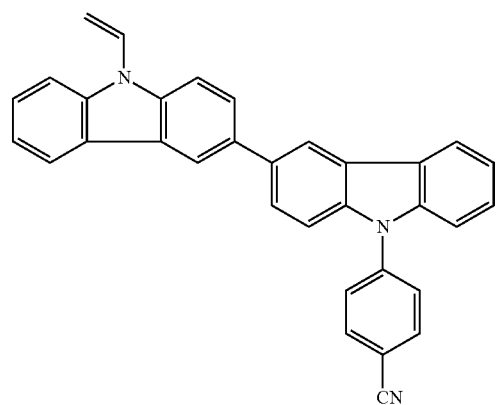
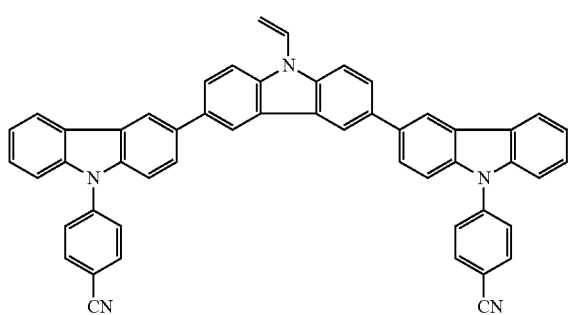
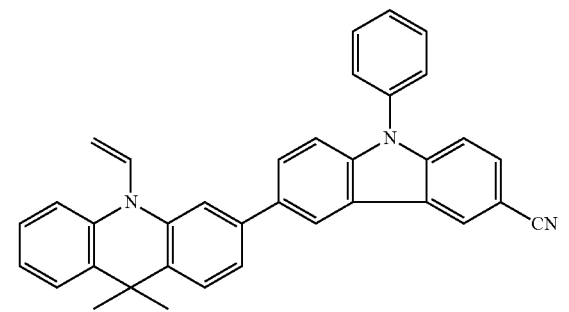
30
-continued
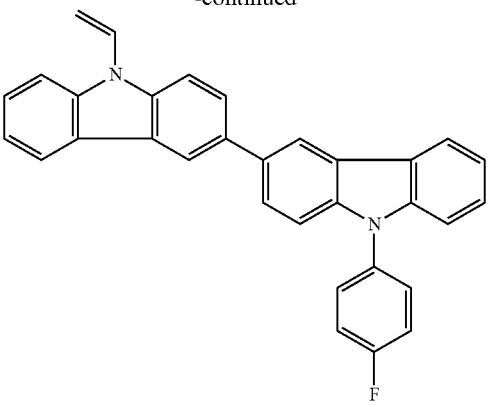
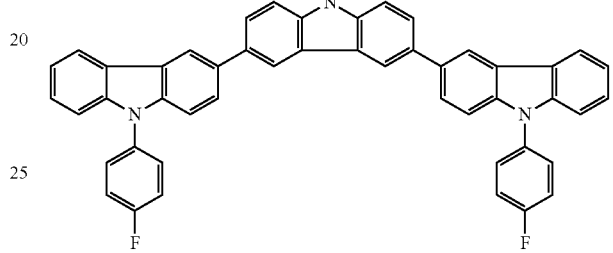
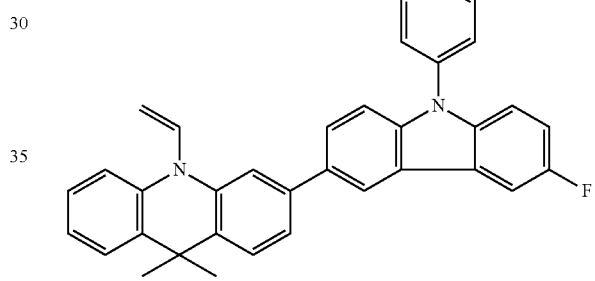
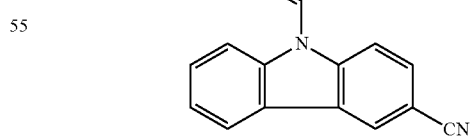
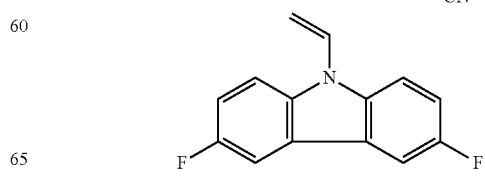

Examples of the monomers of the formula (1) where a is 1 or more are shown below.
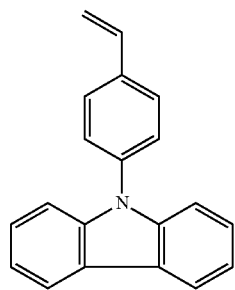 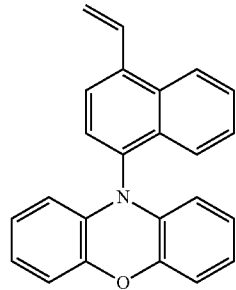 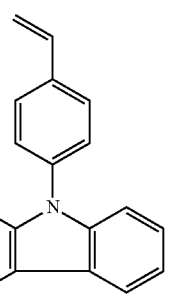 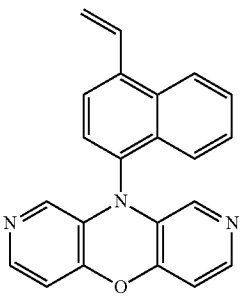
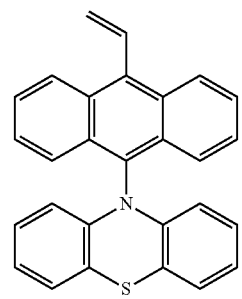 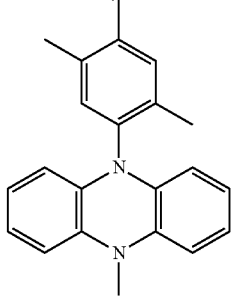 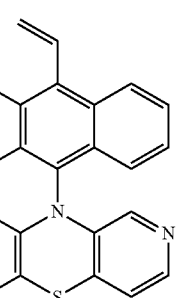 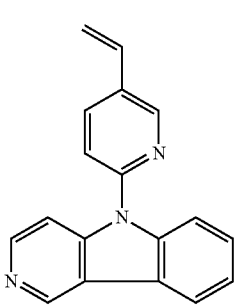
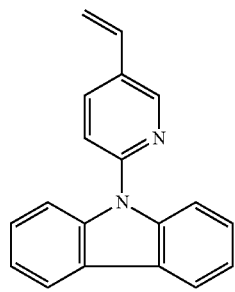 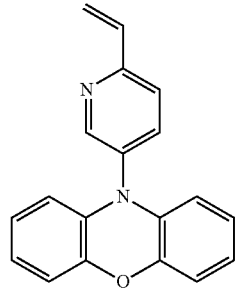 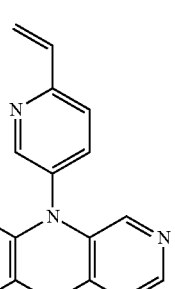 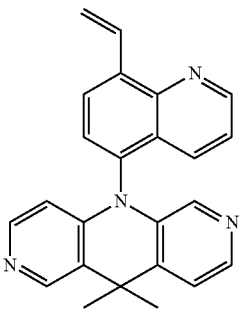
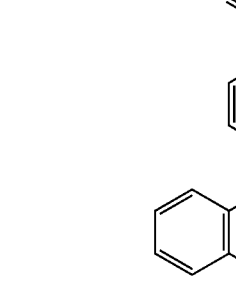 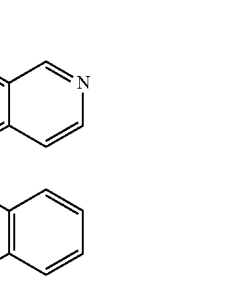 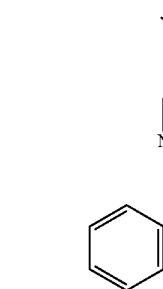 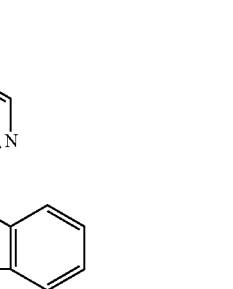
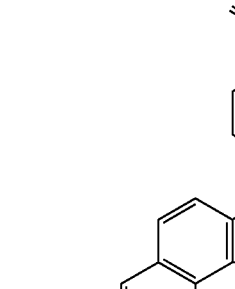 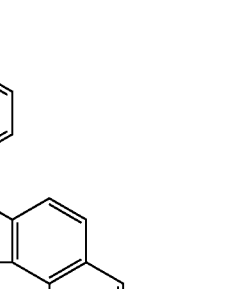 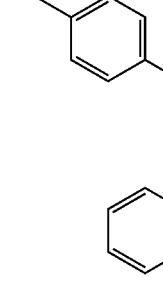 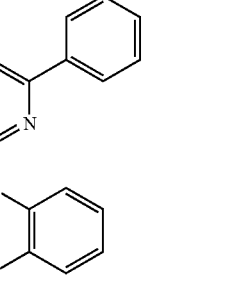

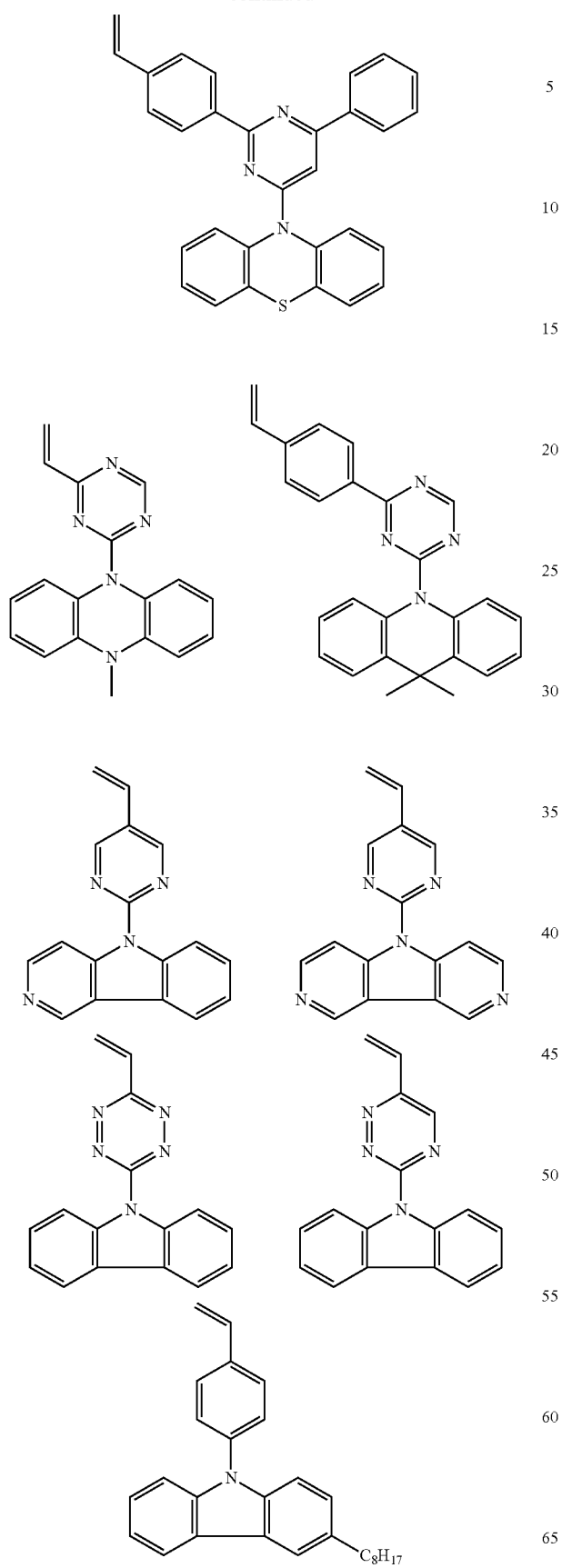
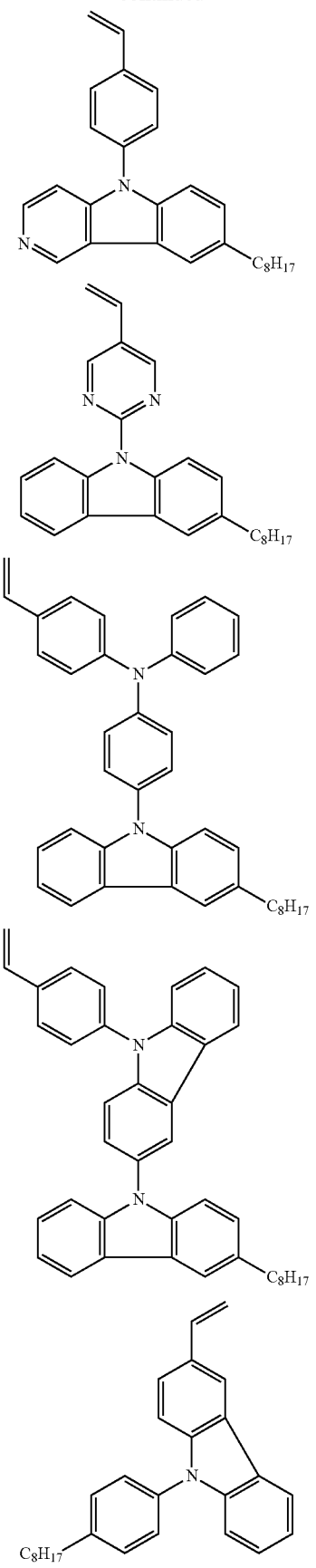

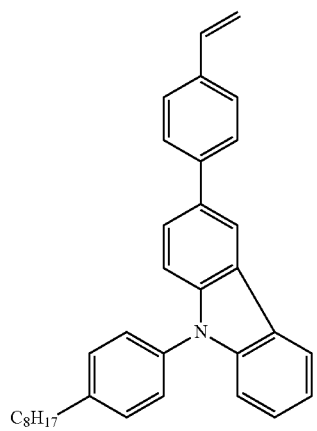
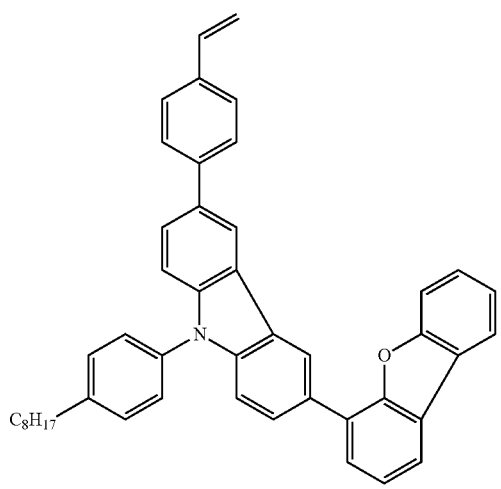
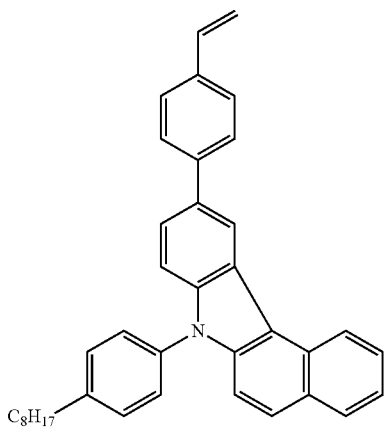

37
-continued
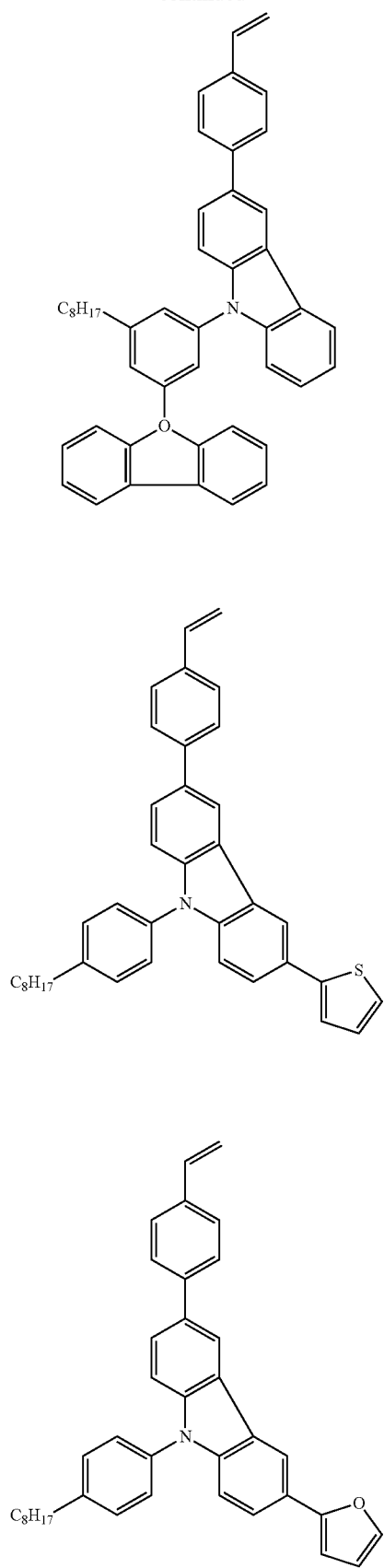
38
-continued
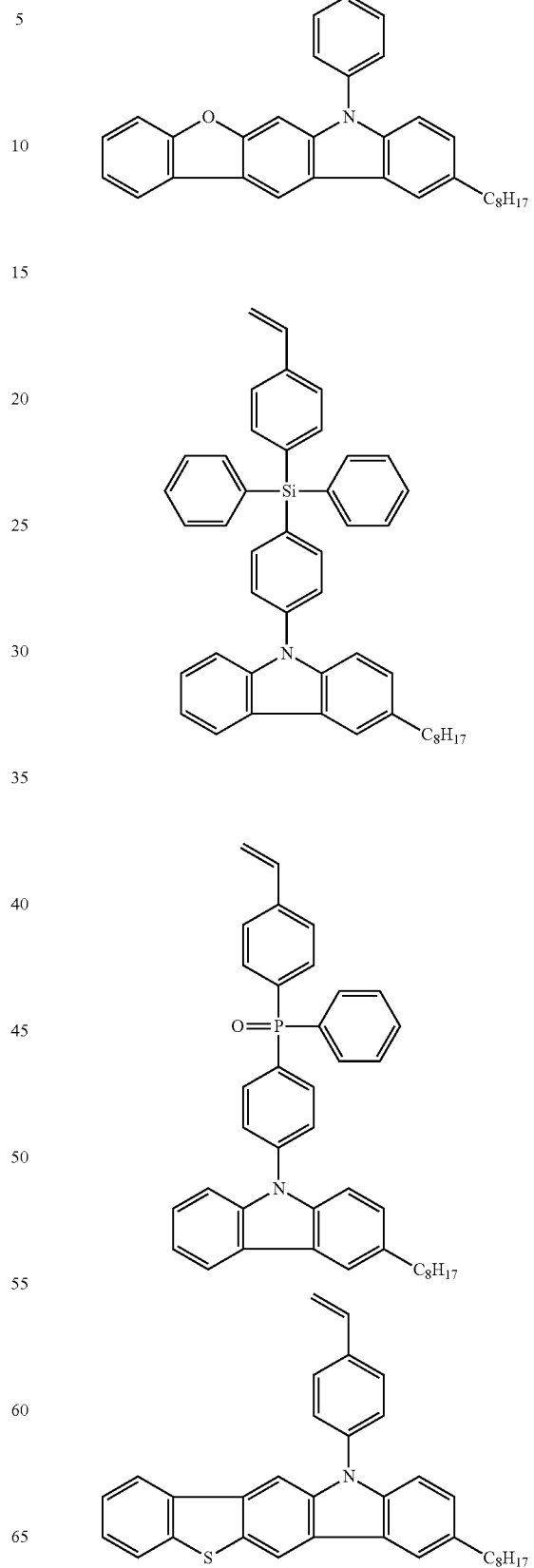

-continued
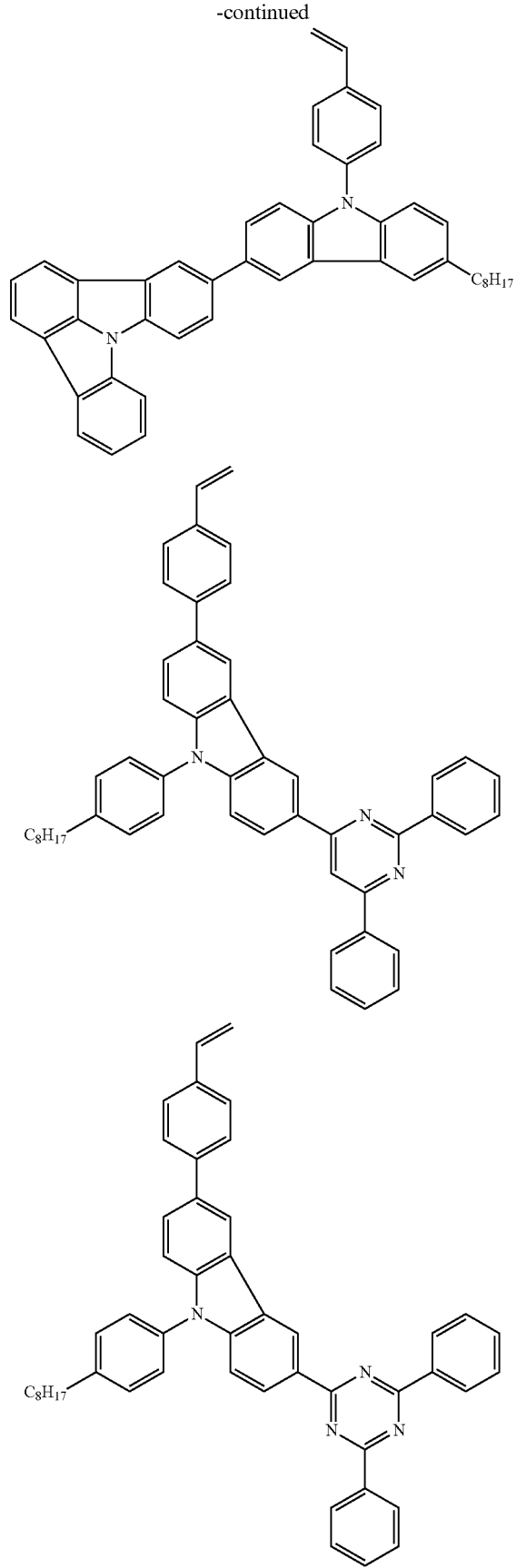
Examples of the monomers of the formula (2) are shown below.

41
-continued
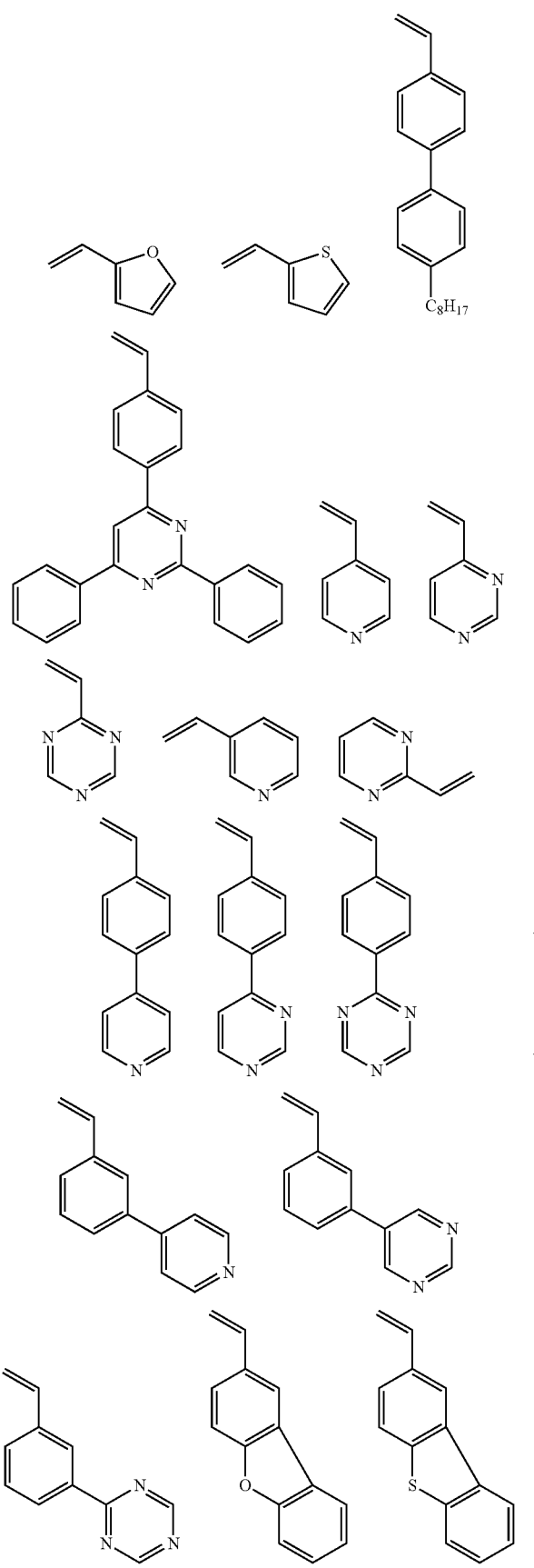
42
-continued
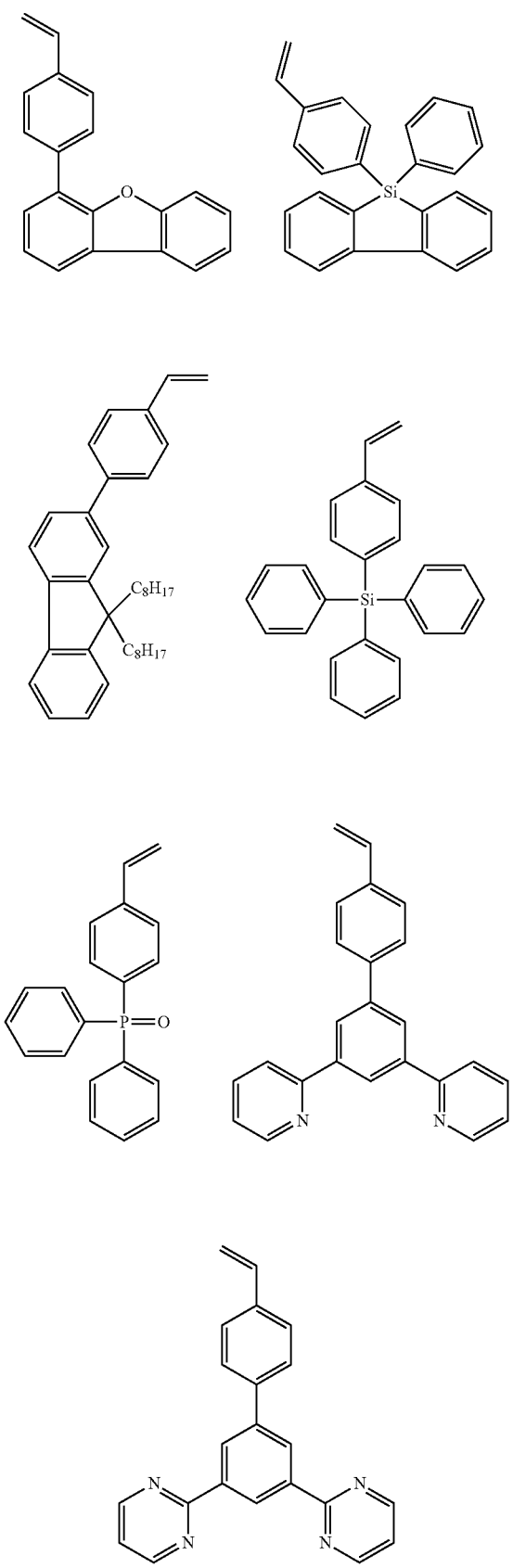

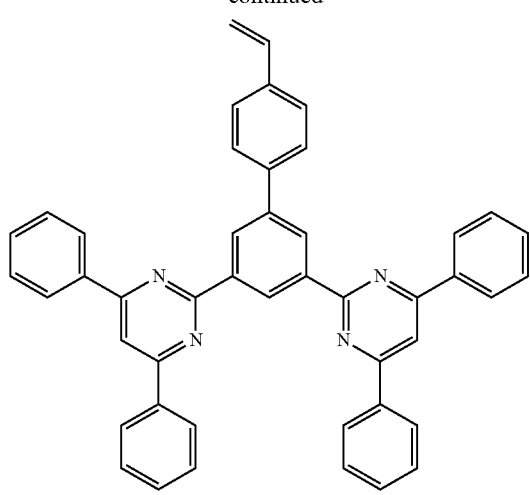
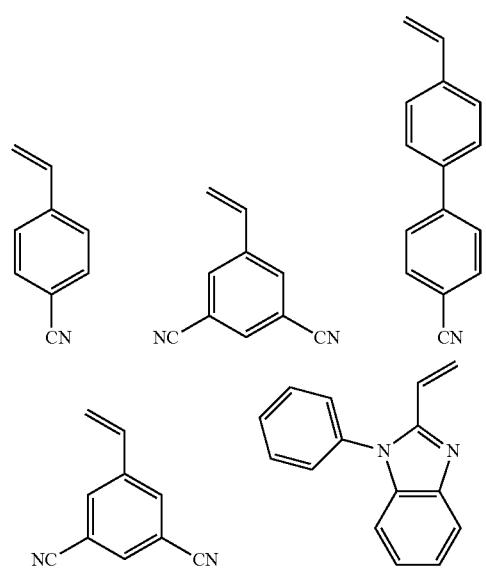
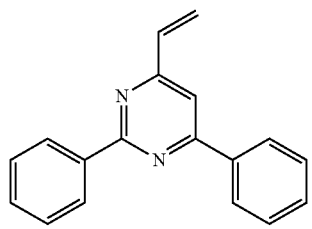
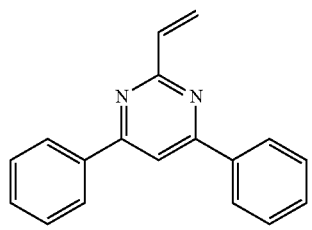
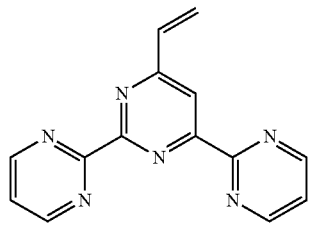
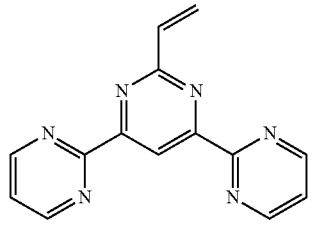
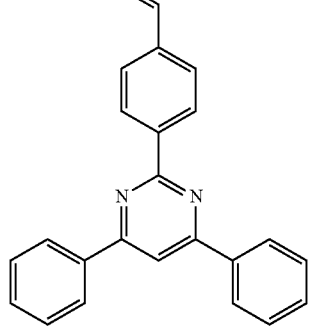
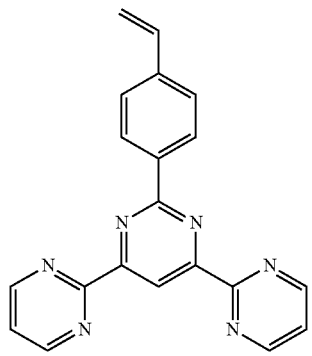

45
-continued
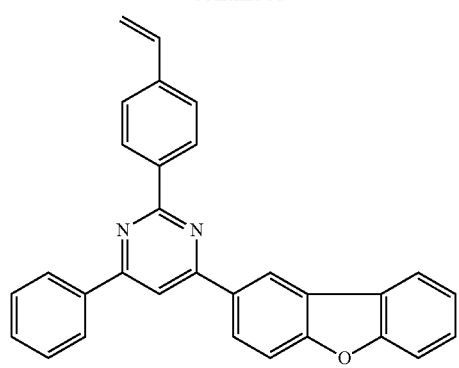
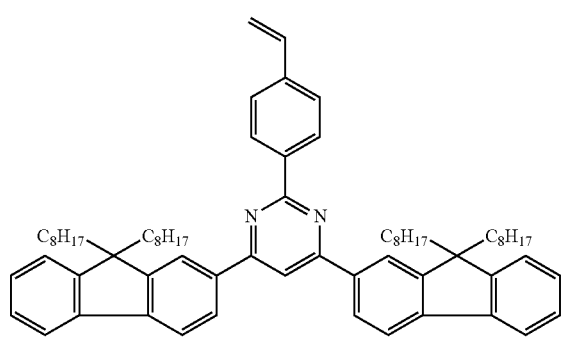
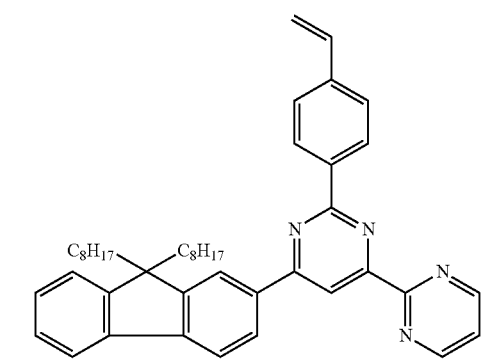
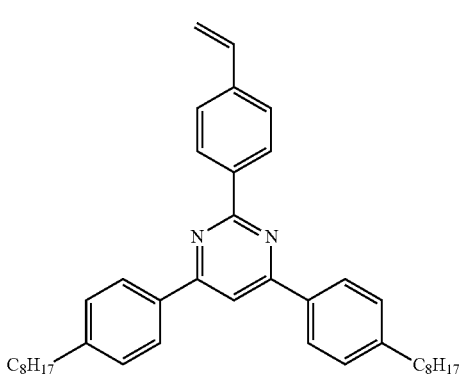
46
-continued
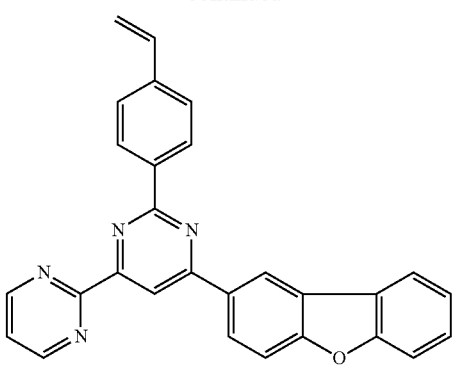
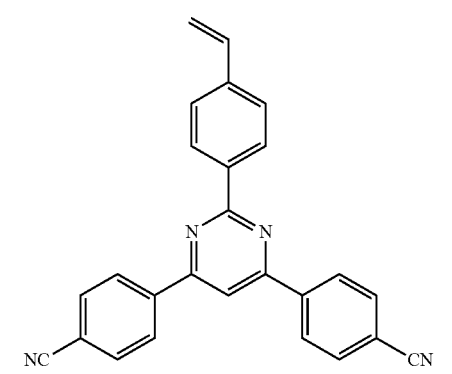
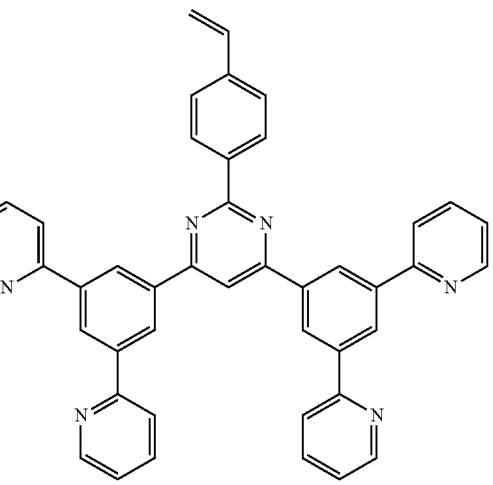
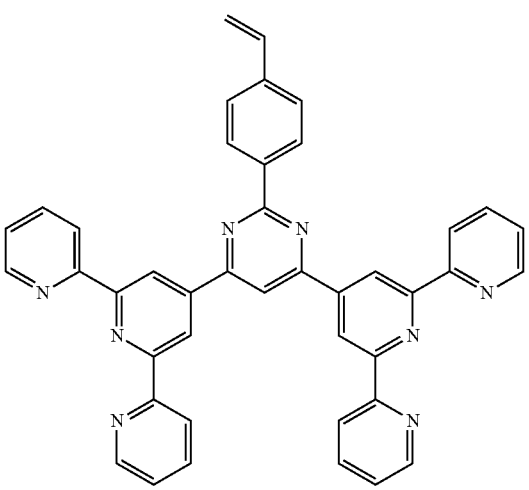

-continued

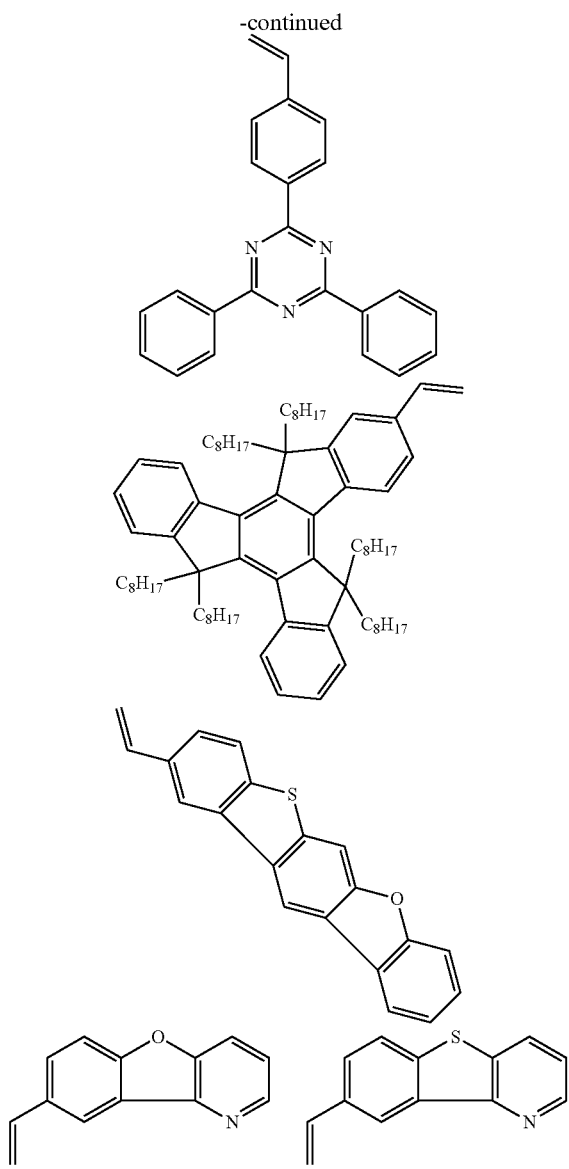

Examples of the monomers of the formula (3) include those of the above-mentioned formula (1) where a is 0 or 1 or more and where the vinyl group or the -(L₁)ₐ-vinyl group bonds to the N atom of the nitrogen-containing condensed hetero ring.

Examples of the monomers of the formula (4) include those of the above-mentioned formula (1) where a is 0 or 1 or more, and n and m are 0, and where the vinyl group or the -(L₁)ₐ-vinyl group bonds to the N atom of the nitrogen-containing condensed hetero ring.

Examples of the monomers of the formula (5) include those of the above-mentioned formula (1) where a is 0 or 1 or more, and n and m are 0, and where the vinyl group or the -(L₁)ₐ-vinyl group bonds to other atom than the N atom of the nitrogen-containing condensed hetero ring.

Examples of the monomers of the formula (6) include those of the above-mentioned formula (1) where a is 0 or 1 or more, and n and m are 0, and where the vinyl group or the -(L₁)ₐ-vinyl group bonds to the N atom of the carbazole.

Examples of the monomers of the formula (7) include those of the above-mentioned formula (1) where a is 0 or 1 or more, and n and m are 0, and where the vinyl group or the -(L₁)ₐ-vinyl group bonds to other atom than the N atom of the carbazole.

The production method for the copolymer of an embodiment of the present invention is not specifically defined, and various already-existing known polymerization methods are employable here. Especially preferred are a bulk polymerization method and a solution polymerization method. Also preferred is radical polymerization or thermal polymerization.

In producing the copolymer of an embodiment of the present invention, if desired, any polymerization initiator generally employed in the art may be added to the system. Not specifically defined, the polymerization initiator includes, for example, organic peroxides such as cumene hydroperoxide, diisopropylbenzene hydroperoxide, di-t-butyl peroxide, lauroyl peroxide, benzoyl peroxide, t-butylperoxy isopropylcarbonate, t-amylperoxy-2-ethylhexanoate, t-butylperoxy-2-ethylhexanoate, etc.; azo compounds such as 2,2'-azobis(isobutyronitrile), 1,1'-azobis(cyclohexanecarbonitrile), 2,2'-azobis(2,4-dimethylvaleronitrile), dimethyl 2,2'-azobis(2-methylpropionate), etc. One alone or two or more different types of these polymerization initiators may be used here either singly or as combined.

With no specific limitation thereon, the amount of the polymerization initiator to be used may be suitably defined depending on the combination of the monomers to be used, the reaction condition, and the molecular weight of the targeted copolymer. From the viewpoint of producing the copolymer having a weight-average molecular weight of from 100,000 to 3,000,000, the amount of the initiator is preferably from 1 to 0.005 mol %, more preferably from 0.5 to 0.01 mol % relative to the total monomer component. When the amount of the polymerization initiator is too large, then bimolecular reaction at the radical terminals may readily occur through recombination or disproportionation so that the molecular weight of the copolymer would be difficult to increase.

For producing the copolymer of an embodiment of the present invention, if desired, any ordinary chain transfer agent may be added for molecular weight control. The chain transfer agent includes, for example, mercaptan-based chain transfer agents such as n-dodecylmercaptan, mercaptoacetic acid, β-mercaptopropionic acid, methyl mercaptoacetate, etc., and α-methylstyrene dimer, etc. The amount of the chain transfer agent, if used, may be suitably determined depending on the combination of the monomers to be used, the reaction condition, and the molecular weight of the targeted copolymer.

In the case where a solvent is used in polymerization, the solvent may be any one usable as a solvent in ordinary radical polymerization. Concretely, for example, the solvent includes ethers such as tetrahydrofuran, dioxane, ethylene glycol dimethyl ether, diethylene glycol dimethyl ether, etc.; ketones such as acetone, methyl ethyl ketone, methyl isobutyl ketone, cyclohexanone, etc.; esters such as ethyl acetate, butyl acetate, propylene glycol monomethyl ether acetate, 3-butoxybutyl acetate, etc.; alcohols such as methanol, ethanol, isopropanol, n-butanol, ethylene glycol monomethyl ether, propylene glycol monomethyl ether, etc.; aromatic hydrocarbons such as toluene, xylene, ethylbenzene, etc.; chlorine-containing hydrocarbon compounds such as chloroform, methylene chloride, etc.; dimethylformamide, dimethyl sulfoxide, etc. One alone or two or more of these solvents may be used here either singly or as combined.

The reaction pressure in polymerization is preferably from 0.01 to 10 MPa as an absolute pressure, more preferably from normal pressure to 1 MPa. Too high pressure is problematic in point of safety operation and would require any specific apparatus, which is disadvantageous for industrial use.

The polymerization temperature and the polymerization concentration (polymerization concentration (%)=[total weight of monomer component/(total weight of monomer component+solvent weight)]×100) may vary depending on the type and the ratio of the monomers to be used and on the molecular weight of the targeted copolymer. For example, the polymerization temperature is preferably a temperature not lower than the melting point of the monomer to be the main component of the copolymer and near the melting point thereof. In this case, the possibility that the polymer would precipitate out during polymerization would be low and therefore a polymer having an increased molecular weight is easy to produce. In solution polymerization using a solvent, the monomers may be polymerized at a further lower temperature, for example, falling within a range of from 0° C. to room temperature (25° C.). On the other hand, when the polymerization temperature is too high, then the type of the solvent to be applicable to the reaction would be limited and the necessary polymerization pressure must be high, which are unfavorable. Preferably, the polymerization temperature is from 0 to 150° C., more preferably from 0 to 100° C.

The polymerization concentration is preferably from 50 to 100%.

From the viewpoint of increasing the molecular weight of the polymer, it is desirable that the polymerization is carried out at a temperature not lower than the melting point of the monomers, especially the monomers used to form the repeating units of the formula (1) and (2), and near to the melting point thereof (for example, melting point to melting point+10° C.).

The copolymer of an embodiment of the present invention may have any other repeating unit than those of the formulae (1) to (7) within a range not contradictory to the object of the invention.

Regarding the molecular weight thereof, the copolymer containing the repeating unit of the formula (1) and containing the repeating unit where a=1 and the repeating unit where a=0 has a weight-average molecular weight (Mw) of from 100,000 to 3,000,000. Also preferably, the other copolymer than these has Mw of from 100,000 to 3,000,000. When the molecular weight of the copolymer is more than 3,000,000, the copolymer of the type may not form a homogeneous film in device production. On the other hand, when the molecular weight is less than 100,000, then the solubility of the copolymer may be difficult to control. For good film formability and solubility, Mw is preferably from 100,000 to 2,500,000, more preferably from 200,000 to 2,500,000.

Preferably, the copolymer containing the repeating unit of the formula (1) and containing the repeating unit where a=1 and the repeating unit where a=0 has a molecular weight distribution represented by Mw/Mn (Mn indicates a number-average molecular weight) of 2 or more. Also preferably, the other copolymer than these has a molecular weight distribution of Mw/Mn of 2 or more. When the ratio is less than 2, precision control of polymerization condition would be necessary and there would be therefore a problem in point of the productivity in some cases. The upper limit of the molecular weight distribution is not specifically defined necessarily, but Mw/Mn is preferably 100 or less.

The number-average molecular weight and the weight-average molecular weight may be determined through gel permeation chromatography (GPC).

The use of the copolymer of an embodiment of the present invention enables thin film formation according to a coating method. As the coating method, preferably employed is a wet-process film formation method. Concretely, employable here are a letterpress method, an intaglio printing method, a planographic printing method, a stencil printing method, a printing method comprising a combination of any of these methods and an offset printing method, an inkjet printing method, a dispenser coating method, a spin coating method, a bar coating method, a dip coating method, a spray coating method, a slit coating method, a roll coating method, a cap coating method, a gravure roll coating method, a meniscus coating method, etc.

In particular, when micropatterning is required, preferred are a letterpress method, an intaglio printing method, a planographic printing method, a stencil printing method, a printing method comprising a combination of any of these methods and an offset printing method, an inkjet printing method, a dispenser coating method, etc. Also employable here is a method that comprises forming a film of the copolymer on a transfer precursor substrate according to the above-mentioned wet-process film formation method followed by transferring the film onto a circuit board having intended electrodes, through laser irradiation or thermal pressing. The film formation according to these methods can be carried out according to conditions well known to those skilled in the art.

The solution of an embodiment of the present invention contains the copolymer of an embodiment of the present invention and a solvent. The copolymer in the solution may be dissolved or dispersed in the solvent therein.

The solvent is preferably an organic solvent, and its examples include, for example, chlorine-containing solvents such as chloroform, chlorobenzene, chlorotoluene, chloroxylene, chloroanisole, dichloromethane, dichlorobenzene, dichlorotoluene, dichloroethane, trichloroethane, trichlorobenzene, trichloromethylbenzene, bromobenzene, dibromobenzene, bromoanisole, etc.; ether solvents such as tetrahydrofuran, dioxane, dioxolane, oxazole, methylbenzoxazole, benzisoxazole, furan, furazane, benzofuran, dihydrobenzofuran, etc.; aromatic hydrocarbon solvents such as ethylbenzene, diethylbenzene, triethylbenzene, trimethylbenzene, trimethoxybenzene, propylbenzene, isopropylbenzene, diisopropylbenzene, dibutylbenzene, amylbenzene, dihexylbenzene, cyclohexylbenzene, tetramethylbenzene, dodecylbenzene, benzonitrile, acetophenone, methylacetophenone, methoxyacetophenone, ethyl toluate, toluene, ethyltoluene, methoxytoluene, dimethoxytoluene, trimethoxytoluene, isopropyltoluene, xylene, butylxylene, isopropylxylene, anisole, ethylanisole, dimethylanisole, trimethylanisole, propylanisole, isopropylanisole, butylanisole, methylethylanisole, anethole, anisyl alcohol, methyl benzoate, ethyl benzoate, propyl benzoate, butyl benzoate, diphenyl ether, butyl phenyl ether, benzyl methyl ether, benzyl ethyl ether, methylenedioxybenzene, methylnaphthalene, tetrahydronaphthalene, aniline, methylaniline, ethylaniline, butylaniline, biphenyl, methylbiphenyl, isopropylbiphenyl, etc.; aliphatic hydrocarbon solvents such as cyclohexane, methylcyclohexane, n-pentane, n-hexane, n-heptane, n-octane, n-nonane, n-decane, tetradecane, decalin, isopropylcyclohexane, etc.; ketone solvents such as acetone, methyl ethyl ketone, cyclohexanone, acetophenone, etc.; ester solvents such as ethyl acetate, butyl acetate, ethyl cellosolve acetate, methyl benzoate, phenyl acetate, etc.;

polyalcohols and their derivatives such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol, etc.; alcohol solvents such as methanol, ethanol, propanol, isopropanol, cyclohexanol, etc.; sulfoxide solvents such as dimethyl sulfoxide, etc.; amide solvents such as N-methyl-2-pyrrolidone, N,N-dimethylformamide, etc. One alone or two or more of these organic solvents may be used here either singly or as combined.

Of those, preferred are toluene, xylene, ethylbenzene, amylbenzene, anisole, 4-methoxytoluene, 2-methoxytoluene, 1,2-dimethoxybenzene, mesitylene, tetrahydronaphthalene, cyclohexylbenzene, 2,3-dihydrobenzofuran, cyclohexanone, and methylcyclohexanone, from the viewpoint of the solubility, the uniformity in film formation, the viscosity characteristics thereof, and the applicability to electronic devices.

If desired, a viscosity regulator and a surface tension regulator may be added to the above solvent. It is desirable that the viscosity regulator and the surface tension regulator are so selected that, even though remaining in films, they would not have any influence on the characteristics of devices, or those capable of being removed from films in the film formation step are preferable.

In the present invention, it is preferred that at least one copolymer is contained in a solvent and the copolymer is dispersed or dissolved therein to be a dispersion or a solution thereof.

In thin film formation, an antioxidant not having any influence on the performance of organic EL devices, such as a phosphorus-containing antioxidant or the like may be incorporated. Depending on the intended use, any other compound (for example, acceptor material) or the like may also be incorporated.

The copolymer of an embodiment of the present invention is useful as a material for organic electronic devices, and a material for organic electroluminescent devices. As other electronic devices than organic electroluminescent devices, there are mentioned organic thin film solar cells and organic thin film transistors. The copolymer of an embodiment of the present invention is especially favorable for a material for organic electroluminescent devices, particularly for a material for use in a light-emitting layer or a hole transportation area (hole transport layer, hole injection layer, etc.).

Preferably, the organic EL device of an embodiment of the present invention is an organic electroluminescent device having an anode, a cathode and an organic thin film layer, in which at least one organic thin film layer contains the copolymer or the organic EL device material of an embodiment of the present invention.

The method for producing an organic EL device of an embodiment of the present invention is a method using the above-mentioned solution containing the copolymer as a coating liquid to form an organic thin film according to a coating method.

Preferably, the organic thin film layer is a light-emitting layer or a hole transport region. The layer to be formed in the hole transport region includes a hole transport layer, a hole injection layer, etc. Preferably, the hole transport layer or the hole injection layer is adjacent to the above-mentioned light-emitting layer.

Preferably, the copolymer is contained as the main component in at least one of the hole transport layer and the hole injection layer. Concretely, the content of the copolymer of an embodiment of the present invention in the hole transport layer or the hole injection layer is preferably from 51 to 100% by mass.

Typical device configurations of the organic EL device of an embodiment of the present invention include the following configurations (1) to (13).
(1) Anode/light-emitting layer/cathode
(2) Anode/hole injection layer/light-emitting layer/cathode
(3) Anode/light-emitting layer/electron injection layer/cathode
(4) Anode/hole injection layer/light-emitting layer/electron injection layer/cathode (5) Anode/organic semiconductor layer/light-emitting layer/cathode
(6) Anode/organic semiconductor layer/electron blocking layer/light-emitting layer/cathode
(7) Anode/organic semiconductor layer/light-emitting layer/adhesion-improving layer/cathode
(8) Anode/hole injection layer/hole transport layer/light-emitting layer/electron injection layer/cathode
(9) Anode/insulation layer/light-emitting layer/insulation layer/cathode
(10) Anode/inorganic semiconductor layer/insulation layer/light-emitting layer/insulation layer/cathode
(11) Anode/organic semiconductor layer/insulation layer/light-emitting layer/insulation layer/cathode
(12) Anode/insulation layer/hole injection layer/hole transport layer/light-emitting layer/insulation layer/cathode
(13) Anode/insulation layer/hole injection layer/hole transport layer/light-emitting layer/electron injection layer/cathode Of those, in general, preferably used here is the configuration (8), which, however, is not limitative. Also employable here is a configuration of anode/hole injection layer/interlayer/light-emitting layer/cathode.

In the organic EL device of an embodiment of the present invention, any other known material than the copolymer of an embodiment of the present invention may be used. For example, for the light-emitting layer, there may be exemplified an embodiment containing a phosphorescent material such as a styrylamine compound, an arylamine compound, an iridium complex or the like.

It is preferred for the organic EL device of an embodiment of the present invention to form a layer that contains the copolymer or the organic EL device material of an embodiment of the present invention according to a coating method. In this, the other layer may be formed according to any known method, for example, a dry-process film formation method such as vacuum evaporation, sputtering, plasma coating, ion plating, etc., a wet-process film formation method such as a coating method (e.g., spin coating, dipping, flow coating or the like), a printing method, etc., and the like.

The thickness of each layer is not specifically defined, but each layer must be formed to have a suitable thickness. When the thickness is too large, then large voltage application is needed for obtaining a constant light output and the efficiency would be therefore poor. When the thickness is too small, then pin holes would form and a sufficient light emission brightness could not be realized even though an electric field is given to the device. In general, the film thickness is preferably from 5 nm to 10 µm, but is more preferably from 5 nm to 0.2 µm.

Using various materials and according to various layer formation methods, an anode, a light-emitting layer and optionally a hole injection/transport layer and further optionally an electron injection/transport layer are formed, and a cathode is formed thereby providing an organic EL device.

An organic EL device may also be produced in the reverse order opposite to the above, or that is, from a cathode to an anode.

EXAMPLES

The present invention is described in more detail with reference to the following Examples, however, not overstepping the scope and the spirit thereof, the present invention is not limited to the following Examples.

Example 1

Copolymerization of vinylcarbazole and 9-(4-vinylphenyl)carbazole 2.8 g of 9-(4-vinylphenyl)carbazole and 2.0 g of vinyl carbazole (molar ratio, 1/1) and 1.8 mg of azobisisobutyronitrile (AIBN) were put into a 50-ml Schlenk tube equipped with a stirrer, and with cooling with liquid nitrogen, the apparatus was purged with nitrogen via a vacuum pump. The apparatus was heated with stirring in an oil bath at 67° C. for 8 hours. After cooled, the solid inside the apparatus was dissolved in 50 ml of dimethylformamide, and purified twice through reprecipitation with 800 ml of methanol. The product weighed 4.7 g (yield 98%).

The molecular weight of the product was measured through gel permeation chromatography (GPC), and the number-average molecular weight (Mn) thereof was 49,700, the weight-average molecular weight (Mw) thereof was 2,033,000, and Mw/Mn thereof was 40.9.

The viscosity of the resultant product was measured and was 11.5 mPa·s.

The viscosity was measured in the manner mentioned below.

The solution for viscosity measurement was prepared by weighing the polymer compound thus obtained and anisole in a vial tube so that the compound concentration therein could be 2% by mass, followed by heating with stirring therein at 90° C. For viscosity measurement, used was an oscillating viscometer under a condition of room temperature (in a clean room set at 23.5° C.).

The $^1$H-NMR spectral data of the product are shown in FIG. 1.

The NMR and GPC apparatus used here are described below.

(NMR Measurement Apparatus)

The nuclear magnetic resonance spectrum of the compound was measured with JEOL's GSX-400 (trade name, resolution 400 MHz). As the solvent, used was heavy chloroform.

(GPC Measurement Apparatus)

For molecular weight measurement, used was size exclusion chromatography (SEC). For the measurement, 100 μl of a solution prepared by dissolving 10 mg of a sample in 10 ml of THF (tetrahydrofuran) was injected into the apparatus. The flow rate was 1 ml/min, and the column temperature was set at 40° C. As the SEC apparatus, used was Tosoh Corporation's HLC-8220. As the detector, used was a differential refractometric (RI) detector or a ultraviolet-visible light (UV) detector. As the columns, used were two columns of Tosoh Corporation's TSKgel GMH-XL and one column of TSKgel G2000-XL. As the standard sample polystyrene, used was Tosoh Corporation's TSK standard polystyrene.

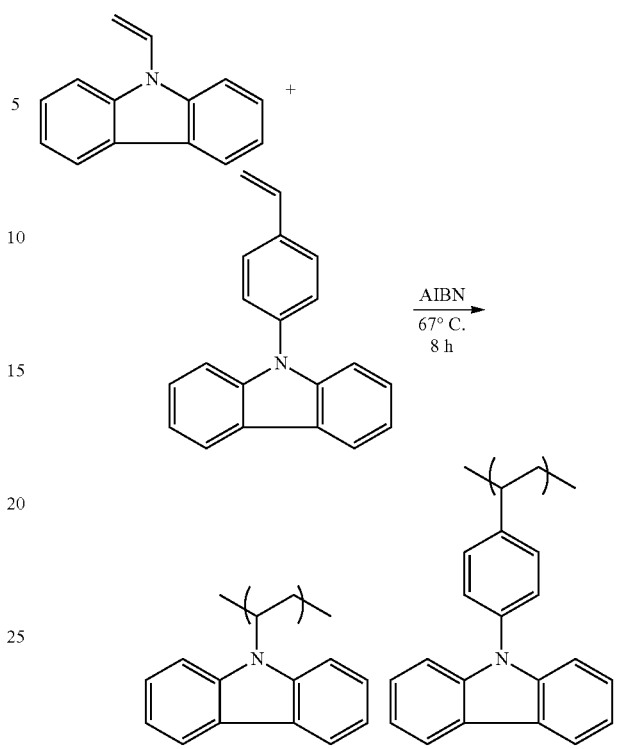

Example 2

Copolymerization of 9-(4-vinylphenyl)carbazole, 4-vinylpyridine and 4-octylstyrene 2.82 g of 9-(4-vinylphenyl)carbazole, 1.10 g of 4-vinylpyridine, 1.95 g of 4-octylstyrene, 10 mg of V70 (2,2'-azobis(4-methoxy-2,4-dimethylvaleronitrile)), and 2.0 g of methylene chloride were put into a 50-ml Schlenk tube equipped with a stirrer, and stirred at 25° C. for 20 hours. This was washed twice with methanol, and dried at 125° C. to give 3.51 g of a product (yield 91%).

The molecular weight of the product, as measured through GPC was: Mn=26,800, Mw=408,300, and Mw/Mn=15.2. The copolymer dissolved in toluene at room temperature.

The viscosity was measured in the same manner as in Example 1, and was 4.34 mPa·s.

Figure 2:
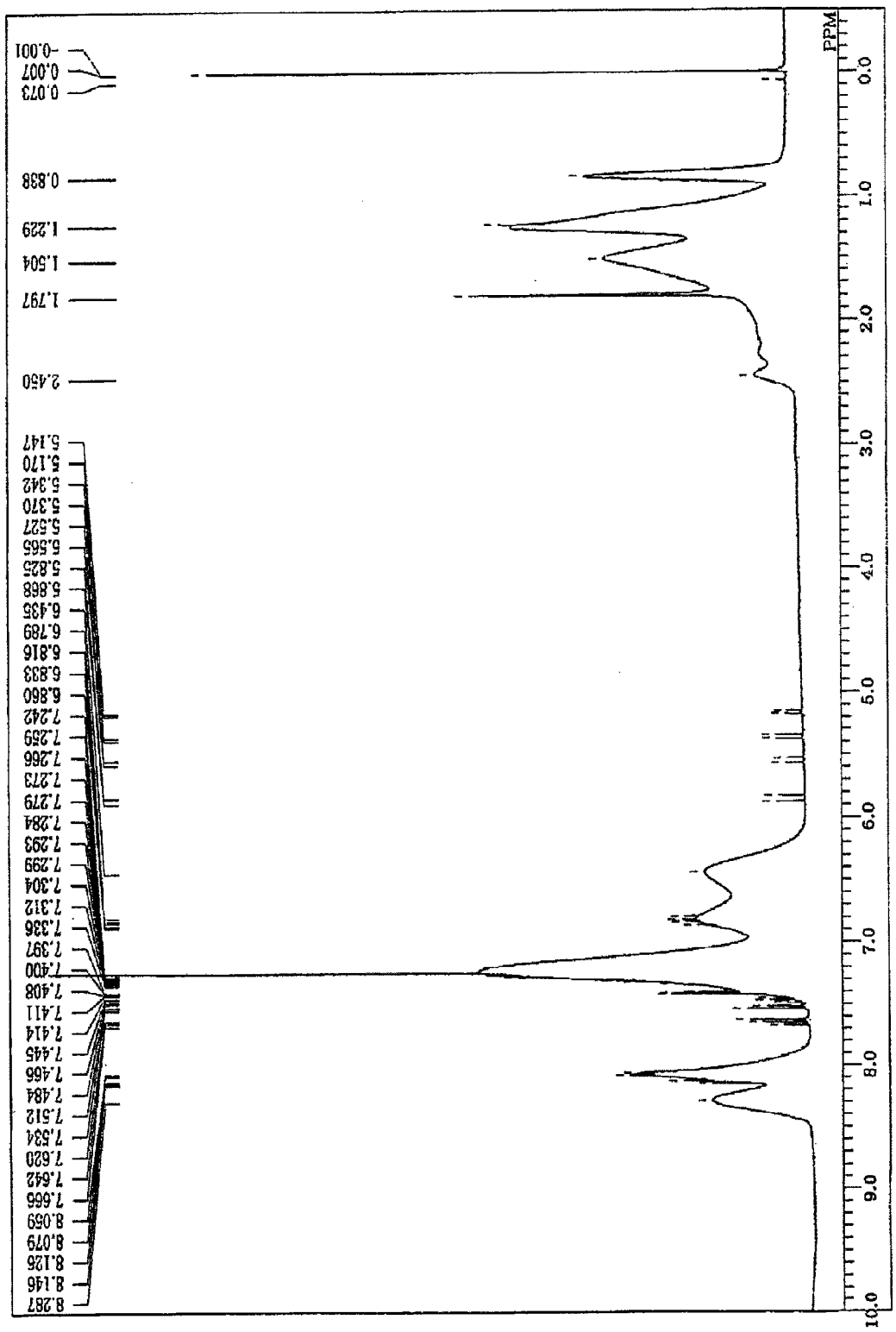
FIG. 2 This is a view showing the $^1$H-NMR data of the copolymer produced in Example 2.

The $^1$H-NMR spectral data of the product are shown in FIG. 2.

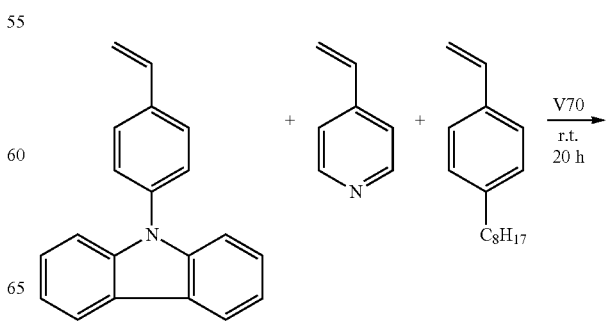

-continued

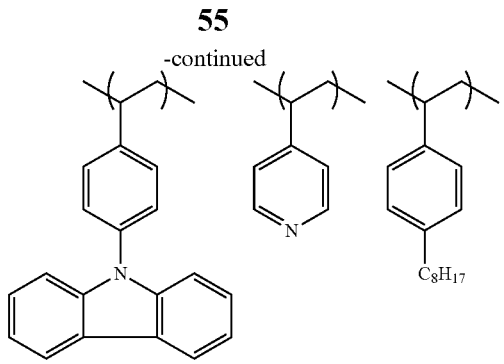

Example 3

Copolymerization of vinylcarbazole and 4-vinylpyridine 7.0 g of vinylcarbazole, 0.20 g of 4-vinylpyridine and 15.5 mg of azobisisobutyronitrile were put into a 50-ml Schlenk tube equipped with a stirrer, and with cooling with liquid nitrogen, the apparatus was purged with nitrogen via a vacuum pump. The apparatus was heated with stirring in an oil bath at 67° C. for 10 hours. After cooled, the solid inside the apparatus was dissolved in 50 ml of dimethylformamide, and purified twice through reprecipitation with 500 ml of methanol. The product weighed 4.03 g (yield 56%).

The molecular weight of the product, as measured through GPC was: Mn=174,000, Mw=1,980,000, and Mw/Mn=11.4.

The viscosity was measured in the same manner as in Example 1, and was 16.1 mPa·s.

Figure 3:
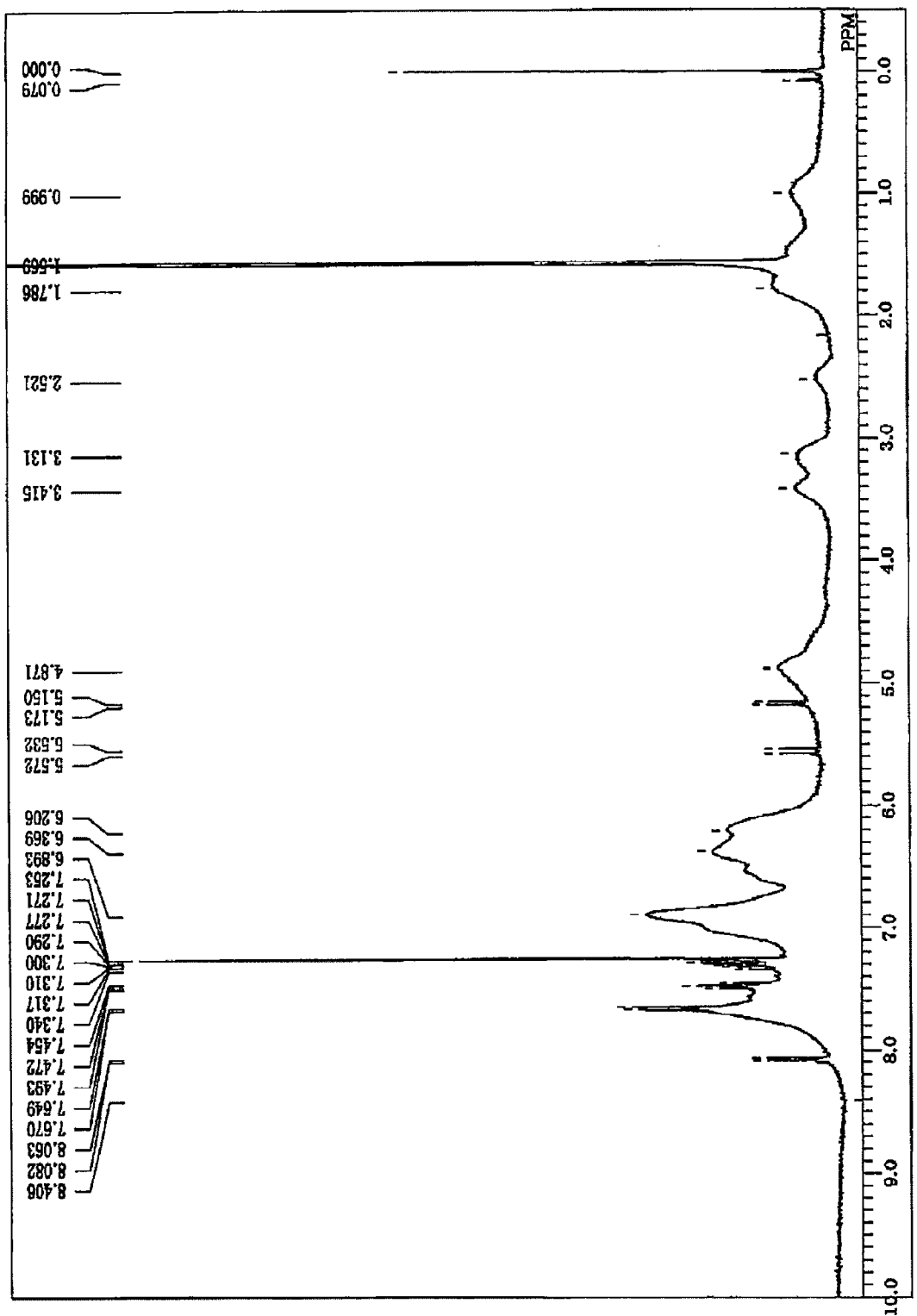
FIG. 3 This is a view showing the $^1$H-NMR data of the copolymer produced in Example 3.

The $^1$H-NMR spectral data of the product are shown in FIG. 3.

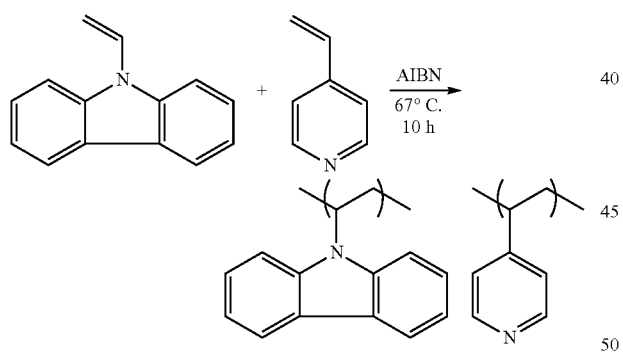

Comparative Example 1

Polymerization of vinylphenylcarbazole 8.0 g of 9-(4-vinylphenyl)carbazole was put into a 50-ml Schlenk tube equipped with a stirrer, and with cooling with liquid nitrogen, the apparatus was purged with nitrogen via a vacuum pump. The apparatus was heated with stirring in an oil bath at 125° C. for 8 hours. After cooled, the solid inside the apparatus was dissolved in 50 ml of dimethylformamide, and purified twice through reprecipitation with 500 ml of methanol. The product weighed 3.8 g (yield 96%).

The molecular weight of the product, as measured through GPC was: Mn=13,000, Mw=51,000, and Mw/Mn=3.9.

The viscosity was measured in the same manner as in Example 1, and was 1.60 mPa·s. As compared with that in Examples, the viscosity was low, and it is therefore expected that the coating performance of the compound would be poor.

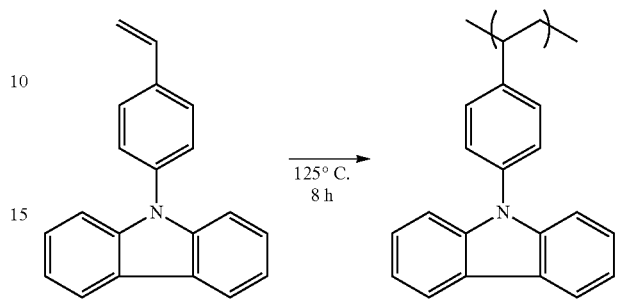

<Fluorescent Spectrometry of Thin Film Formed Using Organic EL Device Material Solution>

Example 4

Using dichloromethane as a solvent, a solution containing 1% by mass of the material in Example 1 as a host was prepared, and a solution was prepared by adding Ir(n-BuPPy)$_3$ mentioned below as a dopant to provide a concentration of 10% by mass relative to the host. Next, this was applied onto a quartz substrate (25×25×1 mm) in a mode of spin coating (500 rpm×3 sec, followed by 3000 rpm×60 sec), dried with air and then heated and dried on a hot plate at 100° C. for 30 minutes. The operation was entirely carried out in a nitrogen atmosphere in a glove box.

Figure 4:
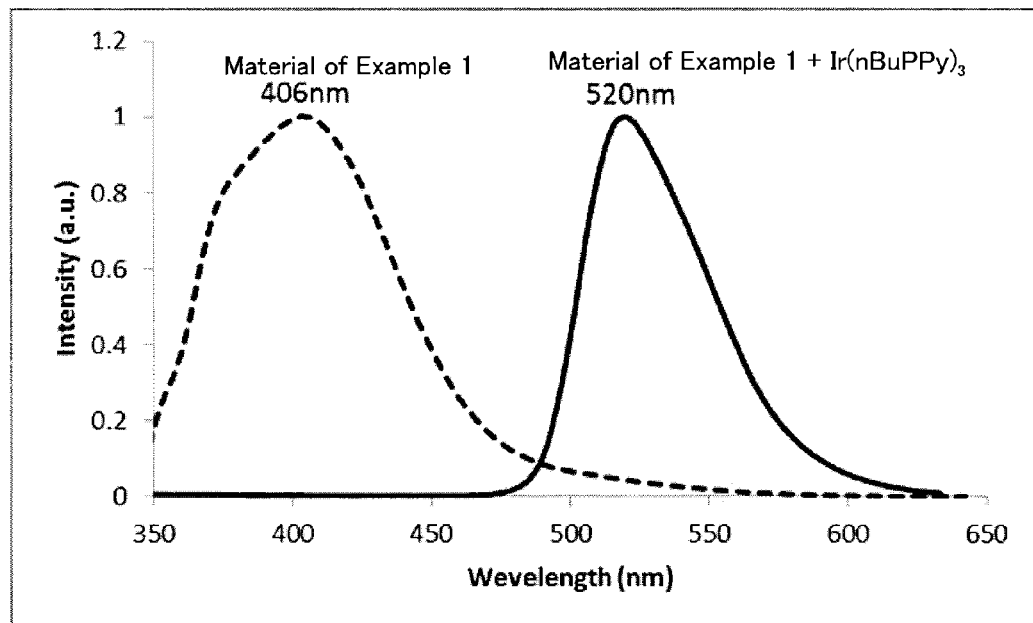
FIG. 4 This is a view showing the emission spectral data of the organic EL device material solution in Example 4.

Next, the fluorescent spectrum of the resultant thin film was measured using an excited light of 350 nm. In FIG. 4, the left side shows the fluorescent spectrum of the thin film formed using the material of Example 1 as a host alone; and the right side in FIG. 4 shows the emission spectrum of the thin film formed using the material of Example 1+Ir(n-BuPPy)$_3$. The fluorescent emission was observed and in the dopant-added system, emission resulting from the dopant was observed. From these, it can be seen that the copolymer of the present invention may be used as a material for electronic devices, especially as a material for organic EL devices.

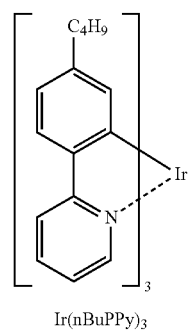

Ir(nBuPPy)$_3$

Example 5

In the same manner as in Example 4 except that the host was changed to the material of Example 2, a solution was prepared and a thin film was formed, and the fluorescent spectrum was measured.

Figure 5:
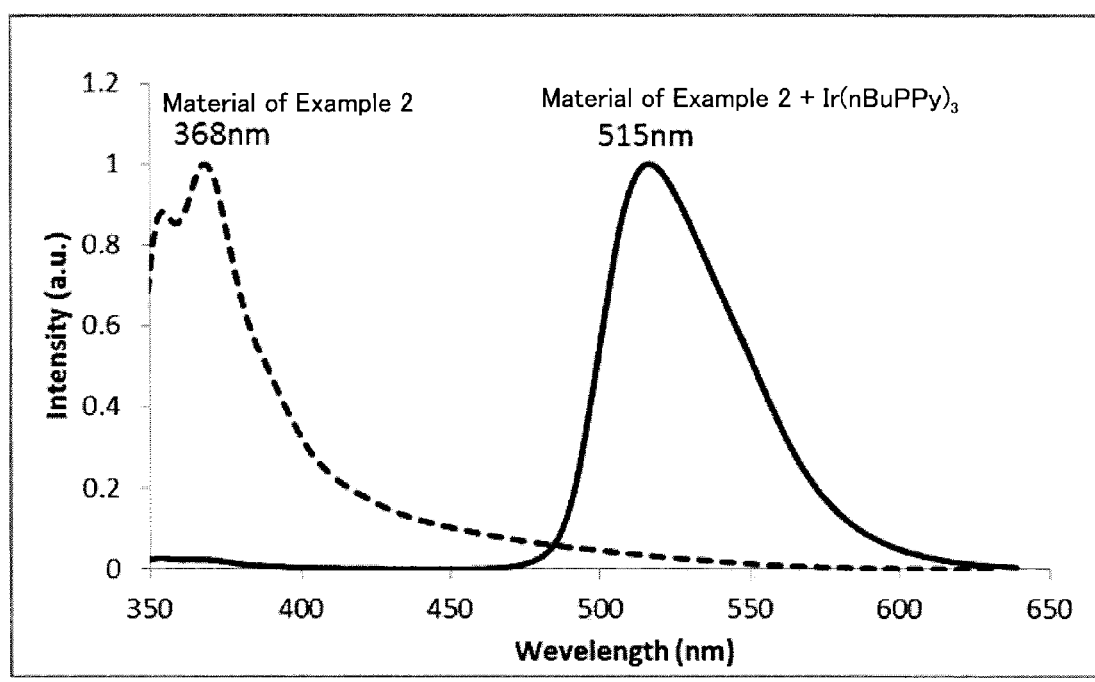
FIG. 5 This is a view showing the emission spectral data of the organic EL device material solution in Example 5.

In FIG. 5, the left side shows the fluorescent spectrum of the thin film formed using the material of Example 1 as a host alone; and the right side in FIG. 5 shows the emission spectrum of the thin film formed using the material of Example 2+Ir(nBuPPy)₃. The fluorescent emission was observed and in the dopant-added system, emission resulting from the dopant was observed. From these, it can be seen that the copolymer of the present invention may be used as a material for electronic devices, especially as a material for organic EL devices.

Example 6

In the same manner as in Example 4 except that the host was changed to the material of Example 3, a solution was prepared and a thin film was formed, and the fluorescent spectrum was measured.

Figure 6:
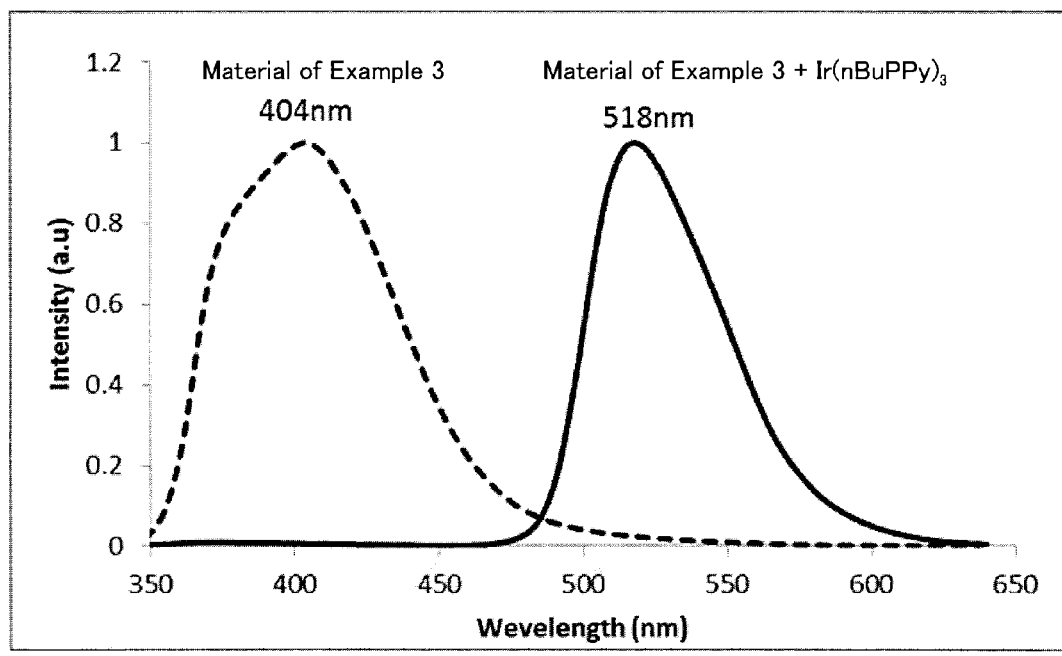
FIG. 6 This is a view showing the emission spectral data of the organic EL device material solution in Example 6.

In FIG. 6, the left side shows the fluorescent spectrum of the thin film formed using the material of Example 1 as a host alone; and the right side in FIG. 6 shows the emission spectrum of the thin film formed using the material of Example 3+Ir(nBuPPy)₃. The fluorescent emission was observed and in the dopant-added system, emission resulting from the dopant was observed. From these, it can be seen that the copolymer of the present invention may be used as a material for electronic devices, especially as a material for organic EL devices.

What is claimed is:
1. A copolymer, consisting essentially of:
   at least one repeating unit according to formula (1); and
   at least one repeating unit according to formula (2);
   wherein:
   the copolymer has a weight-average molecular weight of 100,000 to 3,000,000;
   formula (1) is:

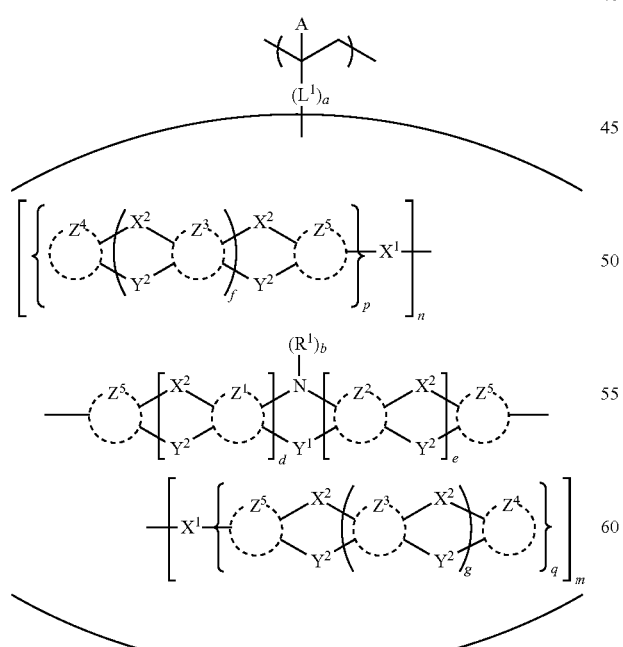

wherein:
   A represents a hydrogen atom or a substituted or unsubstituted alkyl group having a carbon number of from 1 to 10;
   each $X^1$ independently represents a single bond, O (oxygen atom), S (sulfur atom), a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroaiylene group having 5 to 30 ring atoms, a substituted or unsubstituted alkylamino group, a substituted or unsubstituted arylamino group, or a substituted silylene group substituted with a substituent selected from alkyl and aryl;
   each of $X^2$, $Y^1$ and $Y^2$ independently represents a single bond, $CR^2_2$, $CR^2$, $NR^2$, N, O, S, or $SiR^2_2$;
   each $R^2$ independently represents a hydrogen atom, a substituted or unsubstituted alkyl group having a carbon number of from 1 to 20, a substituted or unsubstituted cycloalkyl group having 3 to 16 ring carbon atoms, a substituted or unsubstituted aryl group having 6 to 30 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group, provided that $R^2$ bonding to a nitrogen atom is not a hydrogen atom;
   each of $Z^1$ to $Z^5$ independently represents a substituted or unsubstituted aliphatic hydrocarbon cyclic group having 3 to 30 ring carbon atoms, a substituted or unsubstituted aliphatic heterocyclic group having 3 to 30 ring atoms, a substituted or unsubstituted aromatic hydrocarbon cyclic group having 6 to 30 ring carbon atoms, or a substituted or unsubstituted aromatic heterocyclic group having 5 to 30 ring atoms;
   a, b, d, e, f, g, p, q, m and n each independently indicate an integer of from 0 to 5;
   $R^1$ represents a single bond, a substituted or unsubstituted alkyl group having a carbon number of from 1 to 20, a substituted or unsubstituted cycloalkyl group having 3 to 16 ring carbon atoms, a substituted or unsubstituted aryl group having 6 to 50 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, or a substituted silyl group substituted with a substituent selected from alkyl and aryl;

$L^1$ represents a single bond, a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroarylene group having 5 to 30 ring atoms, a substituted or unsubstituted alkylamino group, a substituted or unsubstituted arylamino group, or a substituted silylene group substituted with a substituent selected from alkyl and aryl; and when $L^1$ and $R^1$ bond, the formula contains a repeating unit where a=0 and b=0; and formula (2) is:

(2)

wherein:
A in formula (2) is the same as A in formula (1);
c indicates an integer of from 0 to 5;
$L^2$ represents a single bond, a substituted or unsubstituted alkylene group having a carbon number of from 1 to 20, a substituted or unsubstituted cycloalkylene group having 3 to 16, a substituted or unsubstituted arylene group having 6 to 50, a substituted or unsubstituted aralkylene group having a carbon number of from 7 to 40, a substituted or unsubstituted heteroarylene group having 5 to 30 ring atoms, or a substituted silylene group substituted with a substituent selected from alkyl and aryl;

$L^2$ is not a tricyclic or more polycyclic nitrogen-containing heteroarylene group;

$R^3$ represents a substituted or unsubstituted pyridinyl group, a substituted or unsubstituted pyrimidinyl group, a substituted or unsubstituted triazinyl group, a substituted or unsubstituted phenanthrolinyl group, the substituted groups having a substituent selected from a phenyl group, a 4-octylphenyl group, a 4-cyanophenyl group, a di-octylfluorenyl group, a dibenzofuranyl group, and a pyridinyl group.

2. The copolymer according to claim 1, the formula (1) is represented by formula (3):

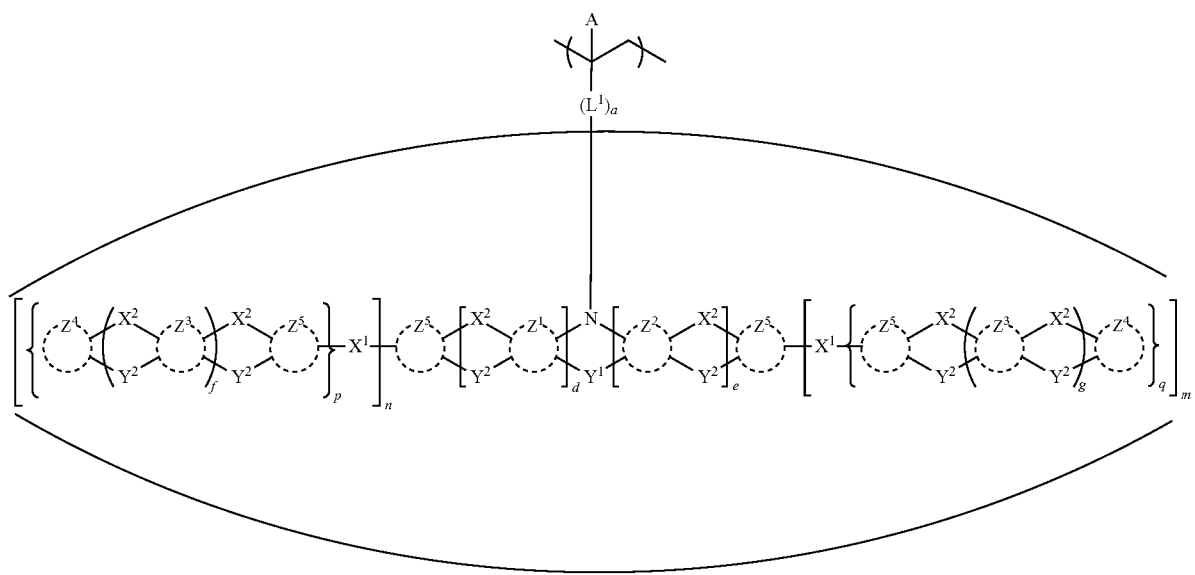

(3)

wherein A, $X^1$, $X^2$, $Y^1$, $Y^2$, $Z^1$ to $Z^5$, $L^1$, a, d, e, f, g, p, q, m and n each are independently the same as in formula (1).

3. The copolymer according to claim 1, wherein c is 0.

4. The copolymer according to claim 1, wherein formula (1) is represented by formula (4) or (5):

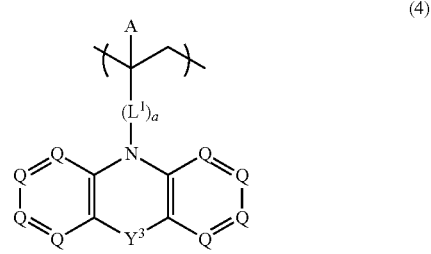

(4)

-continued (5)
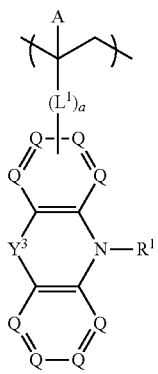

wherein:
A, L¹, R¹, R² and a each are independently the same as in formula (1);
Y³ represents a single bond, CR², N, O or S; and
Q represents CR² or N.

5. The copolymer according to claim 1, wherein formula (1) is represented by the following formula (6) or (7):

(6)
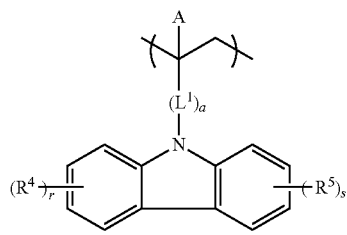

(7)
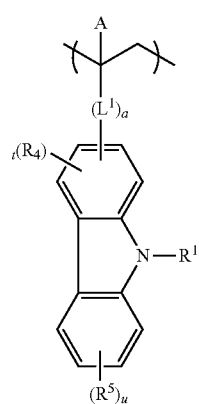

wherein:
A, L¹, R¹ and a are the same as in formula (1);
t indicates an integer of from 0 to 3;
r, s and u each indicate an integer of from 0 to 4; and
R⁴ and R⁵ each independently represent a hydrogen atom, a substituted or unsubstituted alkyl group having a carbon number of from 1 to 20, a substituted or unsubstituted cycloalkyl group having 3 to 16 ring carbon atoms, a substituted or unsubstituted aryl group having 6 to 30 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group.

6. A material for organic electronic devices comprising the copolymer according to claim 1.

7. A material for organic electroluminescent devices comprising the copolymer according to claim 1.

8. An organic electroluminescent device comprising the material for organic electroluminescent devices according to claim 7.

9. The organic electroluminescent device according to claim 8, which comprises an organic thin film layer comprising the material for organic electroluminescent devices.

10. A method for producing the organic electroluminescent device according to claim 9, comprising forming the organic thin film layer by a coating method.

11. The method according to claim 10, wherein the coating method is a wet-process film formation method.

12. A solution comprising the copolymer according to claim 1 and a solvent.

13. The copolymer according to claim 1, wherein the at least one repeating unit according to formula (1) comprises at least one repeating unit where a is from 1 to 5 and at least one repeating unit where a is 0.

14. The copolymer according to claim 1, a weight-average molecular weight of the copolymer is 408,300 to 3,000,000.

15. The copolymer according to claim 1, wherein a weight-average molecular weight of the copolymer is 1,980,000 to 3,000,000.

16. A copolymer, comprising:
at least one repeating unit according to formula (1); and
at least one repeating unit according to formula (2);
wherein:
a weight-average molecular weight of the copolymer is 1,980,000 to 3,000,000;

formula (1) is:

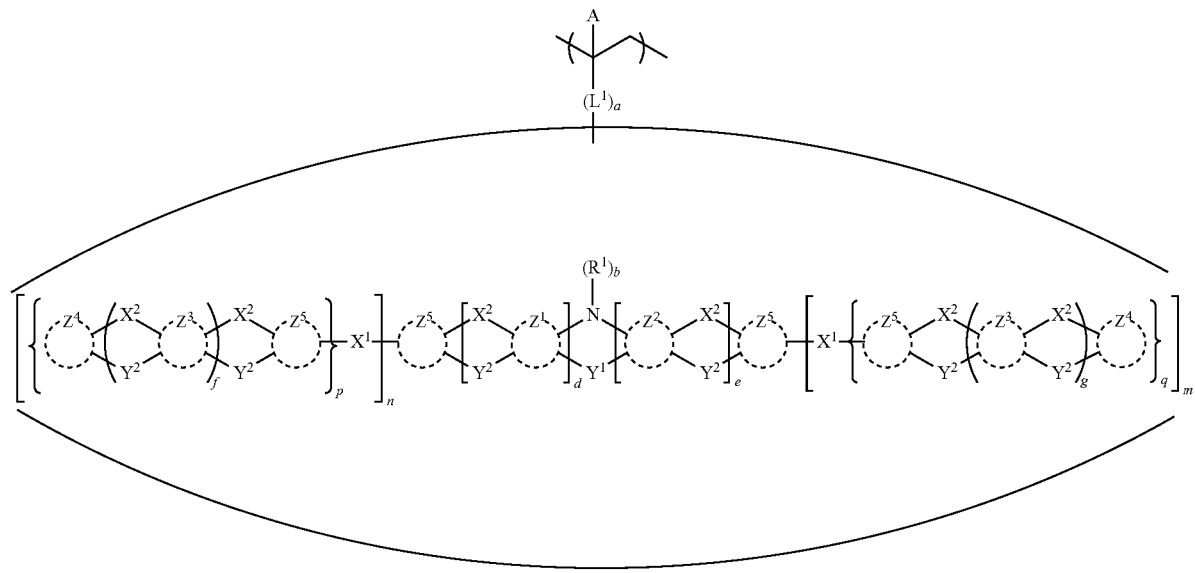

wherein:
A represents a hydrogen atom or a substituted or unsubstituted alkyl group having a carbon number of from 1 to 10;
each $X^1$ independently represents a single bond, O (oxygen atom), S (sulfur atom), a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroarylene group having 5 to 30 ring atoms, a substituted or unsubstituted alkylamino group, a substituted or unsubstituted arylamino group, or a substituted silylene group substituted with a substituent selected from alkyl and aryl;
each of $X^2$, $Y^1$, and $Y^2$ independently represents a single bond, $CR^2_2$, $CR^2$, $NR^2$, N, O, S, or $SiR^2_2$;
each $R^2$ independently represents a hydrogen atom, a substituted or unsubstituted alkyl group having a carbon number of from 1 to 20, a substituted or unsubstituted cycloalkyl group having 3 to 16 ring carbon atoms, a substituted or unsubstituted aryl group having 6 to 30 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group, provided that $R^2$ bonding to a nitrogen atom is not a hydrogen atom;
each of $Z^1$ to $Z^5$ independently represents a substituted or unsubstituted aliphatic hydrocarbon cyclic group having 3 to 30 ring carbon atoms, a substituted or unsubstituted aliphatic heterocyclic group having 3 to 30 ring atoms, a substituted or unsubstituted aromatic hydrocarbon cyclic group having 6 to 30 ring carbon atoms, or a substituted or unsubstituted aromatic heterocyclic group having 5 to 30 ring atoms;
a is 0;
b, d, e, f, g, p, q, m and n each independently indicate an integer of from 0 to 5;
$R^1$ represents a single bond, a substituted or unsubstituted alkyl group having a carbon number of from 1 to 20, a substituted or unsubstituted cycloalkyl group having 3 to 16 ring carbon atoms, a substituted or unsubstituted aryl group having 6 to 50 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, or a substituted silyl group substituted with a substituent selected from alkyl and aryl;
$L^1$ represents a single bond, a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroarylene group having 5 to 30 ring atoms, a substituted or unsubstituted alkylamino group, a substituted or unsubstituted arylamino group, or a substituted silylene group substituted with a substituent selected from alkyl and aryl; and from a phenyl group, a 4-octylphenyl group, a 4-cyanophenyl group, a di-octylfluorenyl group, a dibenzofuranyl group, and a pyridinyl group.

17. The copolymer according to claim 16, wherein formula (1) is represented by formula (3):

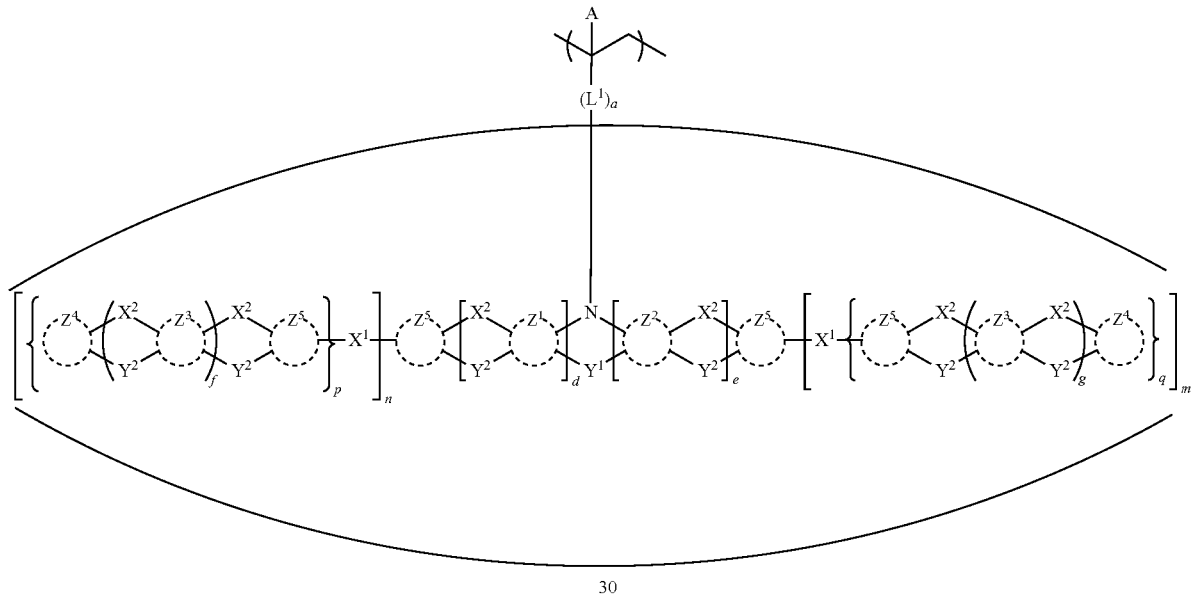

(3)

when $L^1$ and $R^1$ bond, the formula contains a repeating unit where a=0 and b=0; and formula (2) is:

wherein A, $X^1$, $X^2$, $Y^1$, $Y^2$, $Z^1$ to $Z^5$, $L^1$, a, d, e, f, g, p, q, m and n each are independently the same as in formula (1).

18. The copolymer according to claim 16, wherein formula (1) is represented by formula (4) or (5):

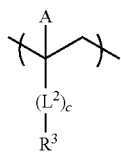

(2)

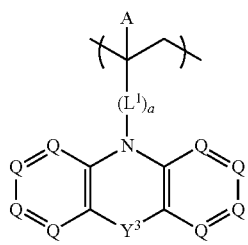

(4)

wherein:
A in formula (2) is the same as A in formula (1);
c indicates an integer of from 0 to 5;
$L^2$ represents a single bond, a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroarylene group having 5 to 30 ring atoms, or a substituted silylene group substituted with a substituent selected from alkyl and aryl;
$L^2$ is not a tricyclic or more polycyclic nitrogen-containing heteroarylene group;
$R^3$ represents a substituted or unsubstituted pyridinyl group, a substituted or unsubstituted pyrimidinyl group, a substituted or unsubstituted triazinyl group, or a substituted or unsubstituted phenanthrolinyl group, the substituted groups having a substituent selected

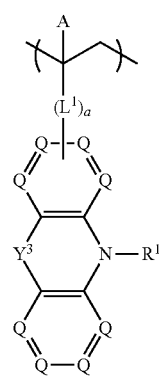

(5)

wherein:
A, $L^1$, $R^1$, $R^2$ and a each are independently the same as in formula (1);
$Y^3$ represents a single bond, $CR^2$, N, O or S; and
Q represents $CR^2$ or N.

19. The copolymer according to claim 16, wherein formula (1) is represented by formula (6) or (7):

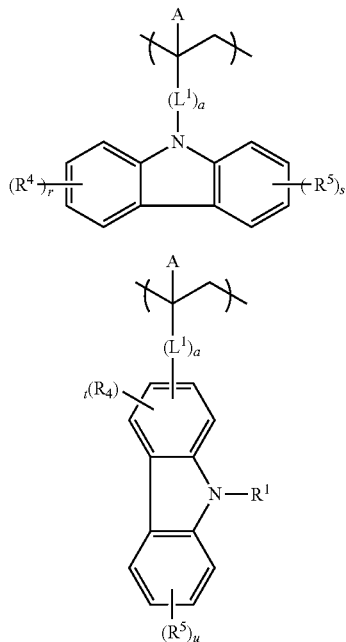

having 6 to 30 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group.

20. A material for organic electronic devices comprising the copolymer according to claim 16.

21. A material for organic electroluminescent devices comprising the copolymer according to claim 16.

22. A solution comprising the copolymer according to claim 16 and a solvent.

23. A material for organic electroluminescent devices, comprising a copolymer, wherein:

the copolymer comprises:

at least one repeating unit according to formula (1); and at least one repeating unit according to formula (2);

wherein:

a weight-average molecular weight of the copolymer is 408,300 to 3,000,000;

formula (1) is:

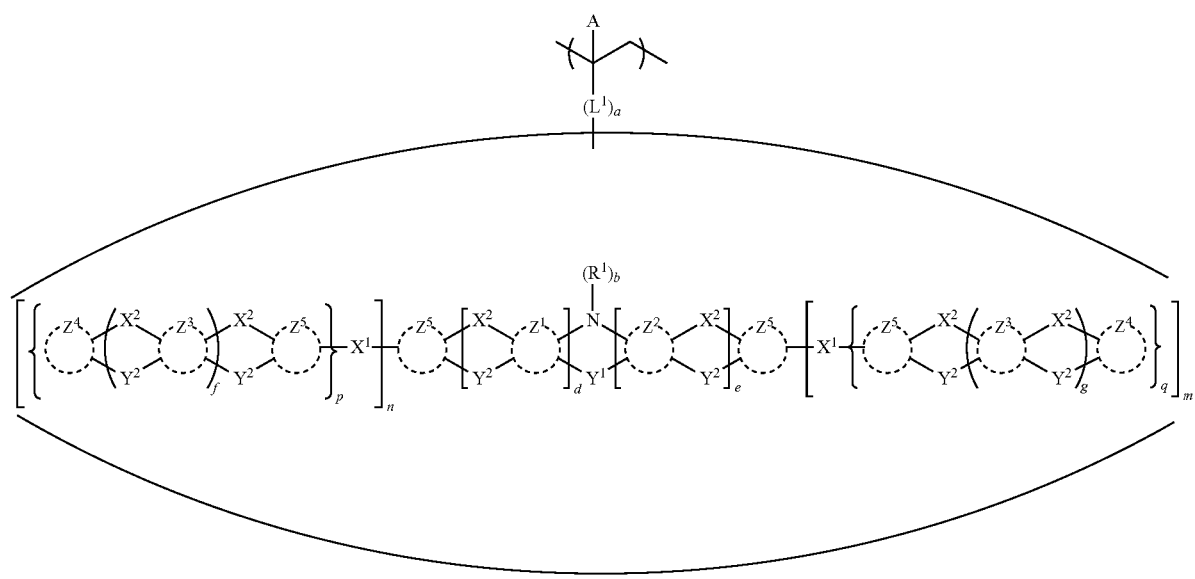

wherein:

A, $L^1$, $R^1$ and a are the same as in formula (1);

t indicates an integer of from 0 to 3;

r, s and u each indicate an integer of from 0 to 4; and $R^4$ and $R^5$ each independently represent a hydrogen atom, a substituted or unsubstituted alkyl group having a carbon number of from 1 to 20, a substituted or unsubstituted cycloalkyl group having 3 to 16 ring carbon atoms, a substituted or unsubstituted aryl group wherein:

A represents a hydrogen atom or a substituted or unsubstituted alkyl group having a carbon number of from 1 to 10;

each $X^1$ independently represents a single bond, O (oxygen atom), S (sulfur atom), a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroarylene group having 5 to 30 ring atoms, a substituted or unsubstituted alkylamino group, a substituted or unsubstituted arylamino group, or a substituted silylene group substituted with a substituent selected from alkyl and aryl;

each of $X^2$, $Y^1$ and $Y^2$ independently represents a single bond, $CR^2_2$, $CR^2$, $NR^2$, N, O, S, or $SiR^2_2$;

each $R^2$ independently represents a hydrogen atom, a substituted or unsubstituted alkyl group having a carbon number of from 1 to 20, a substituted or unsubstituted cycloalkyl group having 3 to 16 ring carbon atoms, a substituted or unsubstituted aryl group having 6 to 30 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, a substituted silyl group substituted with one or more substituents selected from alkyl and aryl, a halogen atom, a nitro group, a cyano group, or a hydroxyl group, provided that $R^2$ bonding to a nitrogen atom is not a hydrogen atom;

each of $Z^1$ to $Z^5$ independently represents a substituted or unsubstituted aliphatic hydrocarbon cyclic group having 3 to 30 ring carbon atoms, a substituted or unsubstituted aliphatic heterocyclic group having 3 to 30 ring atoms, a substituted or unsubstituted aromatic hydrocarbon cyclic group having 6 to 30 ring carbon atoms, or a substituted or unsubstituted aromatic heterocyclic group having 5 to 30 ring atoms;

a, b, d, e, f, g, p, q, m and n each independently indicate an integer of from 0 to 5, provided that the at least one repeating unit according to formula (1) comprises at least one repeating unit where a is from 1 to 5 and at least one repeating unit where a is 0;

$R^1$ represents a single bond, a substituted or unsubstituted alkyl group having a carbon number of from 1 to 20, a substituted or unsubstituted cycloalkyl group having 3 to 16 ring carbon atoms, a substituted or unsubstituted aryl group having 6 to 50 ring carbon atoms, a substituted or unsubstituted alkoxy group having a carbon number of from 1 to 20, a substituted or unsubstituted cycloalkoxy group having 3 to 16 ring carbon atoms, a substituted or unsubstituted aryloxy group having 6 to 30 ring carbon atoms, a substituted or unsubstituted aralkyl group having a carbon number of from 7 to 40, a substituted or unsubstituted heteroaryl group having 5 to 30 ring atoms, a substituted or unsubstituted alkylamino group, a substituted or unsubstituted arylamino group, or a substituted silyl group substituted with a substituent selected from alkyl and aryl;

$L^1$ represents a single bond, a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroarylene group having 5 to 30 ring atoms, a substituted or unsubstituted alkylamino group, a substituted or unsubstituted arylamino group, or a substituted silylene group substituted with a substituent selected from alkyl and aryl; and when $L^1$ and $R^1$ bond, the formula contains a repeating unit where a=0 and b=0; and formula (2) is:

(2)

wherein:

A in formula (2) is the same as A in formula (1);

c indicates an integer of from 0 to 5;

$L^2$ represents a single bond, a substituted or unsubstituted alkylene group having a carbon number of from 1 to 20, a substituted or unsubstituted cycloalkylene group having 3 to 16 ring carbon atoms, a substituted or unsubstituted arylene group having 6 to 50 ring carbon atoms, a substituted or unsubstituted oxyalkylene group having a carbon number of from 1 to 20, a substituted or unsubstituted oxycycloalkylene group having 3 to 16 ring carbon atoms, a substituted or unsubstituted oxyarylene group having 6 to 30 ring carbon atoms, a substituted or unsubstituted aralkylene group having a carbon number of from 7 to 40, a substituted or unsubstituted heteroarylene group having 5 to 30 ring atoms, or a substituted silylene group substituted with a substituent selected from alkyl and aryl;

$L^2$ is not a tricyclic or more polycyclic nitrogen-containing heteroarylene group; and $R^3$ represents a substituted or unsubstituted pyridinyl group, a substituted or unsubstituted pyrimidinyl group, a substituted or unsubstituted triazinyl group, a substituted or unsubstituted phenanthrolinyl group, the substituted groups having a substitutent selected from a phenyl group, a 4-octylphenyl group, a 4-cyanophenyl group, a di-octylfluorenyl group, a dibenzofuranyl group, and a pyridinyl group.

* * * * *